US012125904B2

(12) United States Patent
Ichiryu et al.

(10) Patent No.: US 12,125,904 B2
(45) Date of Patent: Oct. 22, 2024

(54) BIDIRECTIONAL SWITCH MODULE AND BIDIRECTIONAL SWITCH

(71) Applicant: Panasonic Intellectual Property Management Co., Ltd., Osaka (JP)

(72) Inventors: Takashi Ichiryu, Osaka (JP); Yusuke Kinoshita, Kyoto (JP); Ryusuke Kanomata, Osaka (JP); Masanori Nomura, Osaka (JP); Hidetoshi Ishida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 427 days.

(21) Appl. No.: 17/612,542

(22) PCT Filed: May 14, 2020

(86) PCT No.: PCT/JP2020/019191
§ 371 (c)(1),
(2) Date: Nov. 18, 2021

(87) PCT Pub. No.: WO2020/235429
PCT Pub. Date: Nov. 26, 2020

(65) Prior Publication Data
US 2022/0310835 A1 Sep. 29, 2022

(30) Foreign Application Priority Data
May 21, 2019 (JP) .................. 2019-095446

(51) Int. Cl.
*H01L 29/778* (2006.01)
*H01L 23/00* (2006.01)
(Continued)

(52) U.S. Cl.
CPC ...... *H01L 29/7787* (2013.01); *H01L 29/1066* (2013.01); *H01L 29/2003* (2013.01); *H01L 29/205* (2013.01)

(58) Field of Classification Search
CPC ............. H01L 29/7787; H01L 29/1066; H01L 29/205; H01L 29/41758; H01L 29/7786;
(Continued)

(56) References Cited

U.S. PATENT DOCUMENTS

2012/0217542 A1  8/2012  Morita
2013/0119486 A1  5/2013  Kaibara et al.
2019/0326280 A1*  10/2019  Imam ................ H03K 17/6871

FOREIGN PATENT DOCUMENTS

JP  2001-45772 A  2/2001
JP  2002-141506 A  5/2002
(Continued)

OTHER PUBLICATIONS

International Search Report issued in corresponding International Patent Application No. PCT/JP2020/019191, dated Aug. 11, 2020, with English translation.

*Primary Examiner* — Sonya McCall-Shepard
(74) *Attorney, Agent, or Firm* — Rimon P.C.

(57) ABSTRACT

A bidirectional switch module includes a plurality of bidirectional switches and a mount board. Each of the plurality of bidirectional switches includes a first source electrode, a first gate electrode, a second gate electrode, and a second source electrode. On the mount board, the plurality of bidirectional switches are mounted. In the bidirectional switch module, the plurality of bidirectional switches are connected in parallel.

16 Claims, 13 Drawing Sheets

(51) Int. Cl.
*H01L 25/07* (2006.01)
*H01L 27/06* (2006.01)
*H01L 27/07* (2006.01)
*H01L 29/10* (2006.01)
*H01L 29/20* (2006.01)
*H01L 29/205* (2006.01)
*H01L 29/417* (2006.01)
*H01L 29/423* (2006.01)
*H03K 17/12* (2006.01)
*H03K 17/687* (2006.01)

(58) Field of Classification Search
CPC ............ H01L 24/06; H01L 24/48; H01L 2224/49113; H01L 24/49; H01L 2224/0603; H01L 2224/4811; H01L 2224/48227; H01L 2224/49111; H01L 2224/49171; H01L 2224/49175; H01L 25/072; H03K 17/122; H03K 2017/6878; H03K 2217/0009
See application file for complete search history.

(56) References Cited

FOREIGN PATENT DOCUMENTS

| | | |
|---|---|---|
| JP | 2005-237138 A | 9/2005 |
| JP | 2012-23074 A | 2/2012 |
| WO | 2011/064955 A1 | 6/2011 |
| WO | 2016/203764 A1 | 12/2016 |

* cited by examiner

BIDIRECTIONAL SWITCH MODULE AND
BIDIRECTIONAL SWITCH

CROSS REFERENCE TO RELATED APPLICATIONS

This patent application is the U.S. National Phase under 35 U.S.C. § 371 of International Application No. PCT/JP2020/019191, filed on May 14, 2020, which claims the benefit of Japanese Patent Application No. 2019-095446, dated May 21, 2019, the entire contents of each are hereby incorporated by reference in their entirety.

TECHNICAL FIELD

The present disclosure generally relates to a bidirectional switch module and a bidirectional switch. More particularly, the present disclosure relates to a bidirectional switch module including a bidirectional switch with two gate electrodes and also relates to such a bidirectional switch with two gate electrodes.

BACKGROUND ART

A double-gate (also called "dual-gate") semiconductor element has been proposed in the art as an exemplary bidirectional switch (see, for example, Patent Literature 1).

Patent Literature 1 discloses an example in which the semiconductor element is housed in a package.

The semiconductor element of Patent Literature 1 includes: a semiconductor multi-layer structure; a first ohmic electrode (first source electrode) and a second ohmic electrode (second source electrode) which are formed on the semiconductor multi-layer structure to be spaced apart from each other; and a first gate electrode and a second gate electrode which are formed in this order between the first ohmic electrode and the second ohmic electrode from the first ohmic electrode toward the second ohmic electrode.

The first ohmic electrode includes a plurality of first ohmic electrode fingers (first source electrode comb teeth). The second ohmic electrode includes a plurality of second ohmic electrode fingers (second source electrode comb teeth). The first gate electrode includes a plurality of first gate electrode fingers (first gate electrode comb teeth). The second gate electrode includes a plurality of second gate electrode fingers (second gate electrode comb teeth). The semiconductor element includes a plurality of double-gate transistor units, in each of which a first gate electrode finger and a second gate electrode finger are arranged in this order between a first ohmic electrode finger and a second ohmic electrode finger.

The semiconductor element includes an S1 electrode pad (first source electrode pad), an S2 electrode pad (second source electrode pad), a G1 electrode pad (first gate electrode pad), and a G2 electrode pad (second gate electrode pad). The S1 electrode pad is connected to each of the first ohmic electrode fingers of the first ohmic electrode via an S1 electrode line. The S2 electrode pad is connected to each of the second ohmic electrode fingers of the second ohmic electrode via an S2 electrode line. The G1 electrode pad is connected to each of the first gate electrode fingers of the first gate electrode via a G1 electrode line. The G2 electrode pad is connected to each of the second gate electrode fingers of the second gate electrode via a G2 electrode line.

In the field of bidirectional switches, there has been an increasing demand for enabling a larger amount of current to flow therethrough.

CITATION LIST

Patent Literature

Patent Literature 1: WO 2011/064955 A1

SUMMARY OF INVENTION

An object of the present disclosure is to provide a bidirectional switch module and a bidirectional switch, each of which contributes to enabling a large amount of current to flow therethrough.

A bidirectional switch module according to an aspect of the present disclosure includes a plurality of bidirectional switches and a mount board. Each of the plurality of bidirectional switches includes a first source electrode, a first gate electrode, a second gate electrode, and a second source electrode. On the mount board, the plurality of bidirectional switches are mounted. In the bidirectional switch module, the plurality of bidirectional switches are connected in parallel.

A bidirectional switch according to another aspect of the present disclosure includes a first source electrode, a first gate electrode, a second gate electrode, and a second source electrode. The first source electrode includes a plurality of first source electrode comb teeth. The first gate electrode includes a plurality of first gate electrode comb teeth. The second gate electrode includes a plurality of second gate electrode comb teeth. The second source electrode includes a plurality of second source electrode comb teeth. In the bidirectional switch, the plurality of first source electrode comb teeth and the plurality of second source electrode comb teeth are alternately arranged one by one. Between each pair of a first source electrode comb tooth and a second source electrode comb tooth which are adjacent to each other, one first gate electrode comb tooth, out of the plurality of first gate electrode comb teeth, and one second gate electrode comb tooth, out of the plurality of second gate electrode comb teeth, are arranged side by side in this order from the first source electrode comb tooth toward the second source electrode comb tooth. The bidirectional switch further includes a first source electrode pad, a first gate electrode pad, a second gate electrode pad, and a second source electrode pad. The first source electrode pad is electrically connected to the plurality of first source electrode comb teeth. The first gate electrode pad is electrically connected to the plurality of first gate electrode comb teeth. The second gate electrode pad is electrically connected to the plurality of second gate electrode comb teeth. The second source electrode pad is electrically connected to the plurality of second source electrode comb teeth. The bidirectional switch has a first side and a second side which are parallel to each other in a plan view, and a third side and a fourth side which are parallel to each other in a plan view. The first source electrode pad is arranged along the first side. The second source electrode pad is arranged along the second side. The first gate electrode pad is arranged along the third side. The second gate electrode pad is arranged along the fourth side. A distance between the first gate electrode pad and the first source electrode pad is shorter than a distance between the first gate electrode pad and the second source electrode pad. A distance between the second gate electrode pad and the second source electrode pad is shorter than a distance between the second gate electrode pad and the first source electrode pad.

A bidirectional switch according to still another aspect of the present disclosure includes a first source electrode, a first gate electrode, a second gate electrode, and a second source electrode. The first source electrode includes a plurality of first source electrode comb teeth. The first gate electrode includes a plurality of first gate electrode comb teeth. The second gate electrode includes a plurality of second gate electrode comb teeth. The second source electrode includes a plurality of second source electrode comb teeth. In the bidirectional switch, the plurality of first source electrode comb teeth and the plurality of second source electrode comb teeth are alternately arranged one by one. Between each pair of a first source electrode comb tooth and a second source electrode comb tooth which are adjacent to each other, one first gate electrode comb tooth, out of the plurality of first gate electrode comb teeth, and one second gate electrode comb tooth, out of the plurality of second gate electrode comb teeth, are arranged side by side in this order from the first source electrode comb tooth toward the second source electrode comb tooth. The bidirectional switch further includes a first source electrode pad, two first gate electrode pads, two second gate electrode pads, and a second source electrode pad. The first source electrode pad is electrically connected to the plurality of first source electrode comb teeth. The two first gate electrode pads are electrically connected to the plurality of first gate electrode comb teeth. The two second gate electrode pads are electrically connected to the plurality of second gate electrode comb teeth. The second source electrode pad is electrically connected to the plurality of second source electrode comb teeth. The bidirectional switch has a first side and a second side which are parallel to each other in a plan view, and a third side and a fourth side which are parallel to each other in a plan view. The first source electrode pad is arranged along the first side. The second source electrode pad is arranged along the second side. One first gate electrode pad, out of the two first gate electrode pads, and one second gate electrode pad, out of the two second gate electrode pads, are arranged along the third side. Between the first source electrode pad and the second source electrode pad, the one first gate electrode pad is located closer to the first source electrode pad than to the second source electrode pad, and the one second gate electrode pad is located closer to the second source electrode pad than to the first source electrode pad. The other first gate electrode pad, out of the two first gate electrode pads, and the other second gate electrode pad, out of the two second gate electrode pads, are arranged along the fourth side. Between the first source electrode pad and the second source electrode pad, the other first gate electrode pad is located closer to the first source electrode pad than to the second source electrode pad, and the other second gate electrode pad is located closer to the second source electrode pad than to the first source electrode pad.

DESCRIPTION OF EMBODIMENTS

Figure 1:
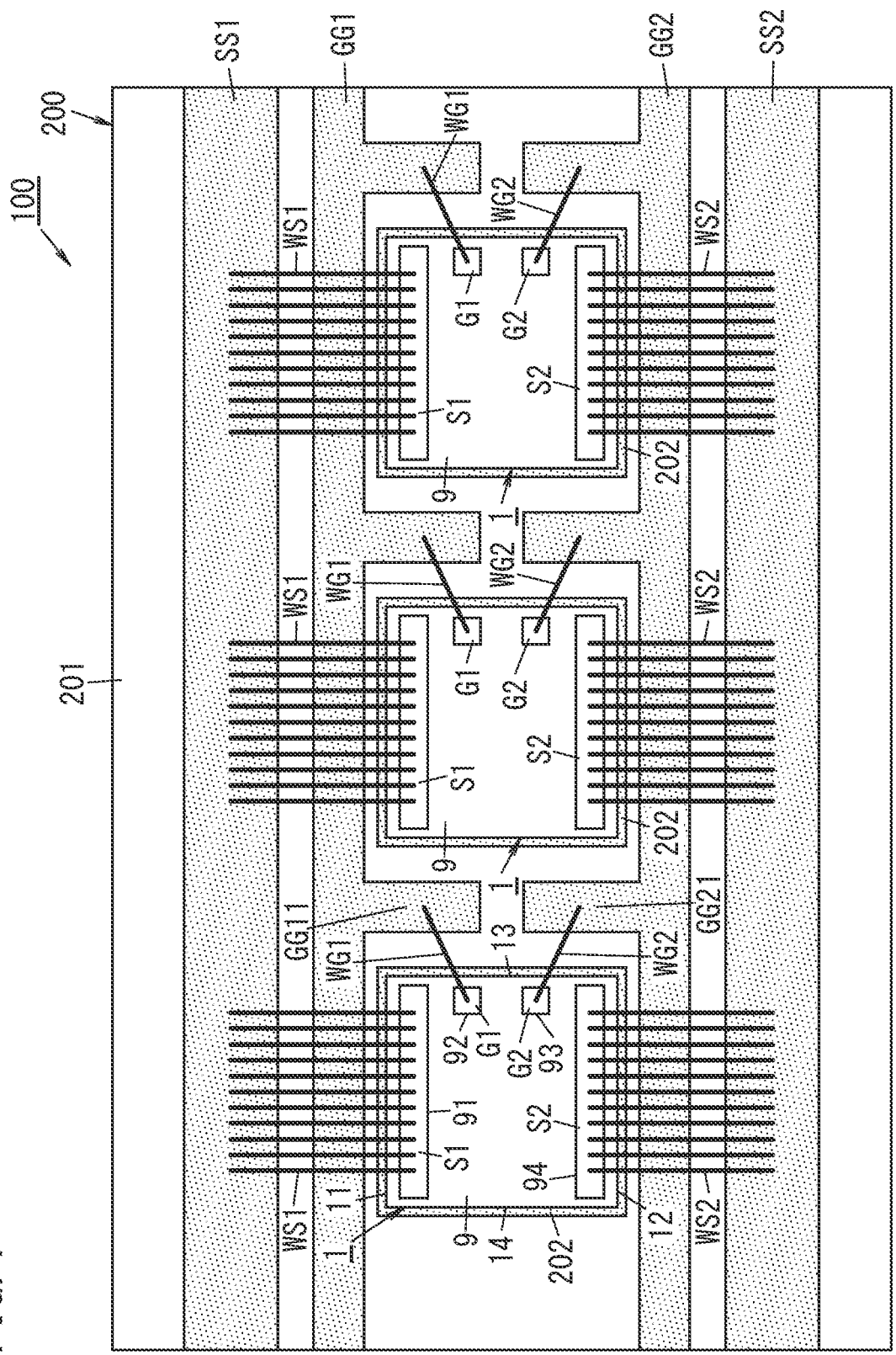
FIG. 1 is a plan view of a bidirectional switch module according to a first embodiment.
Figure 13:
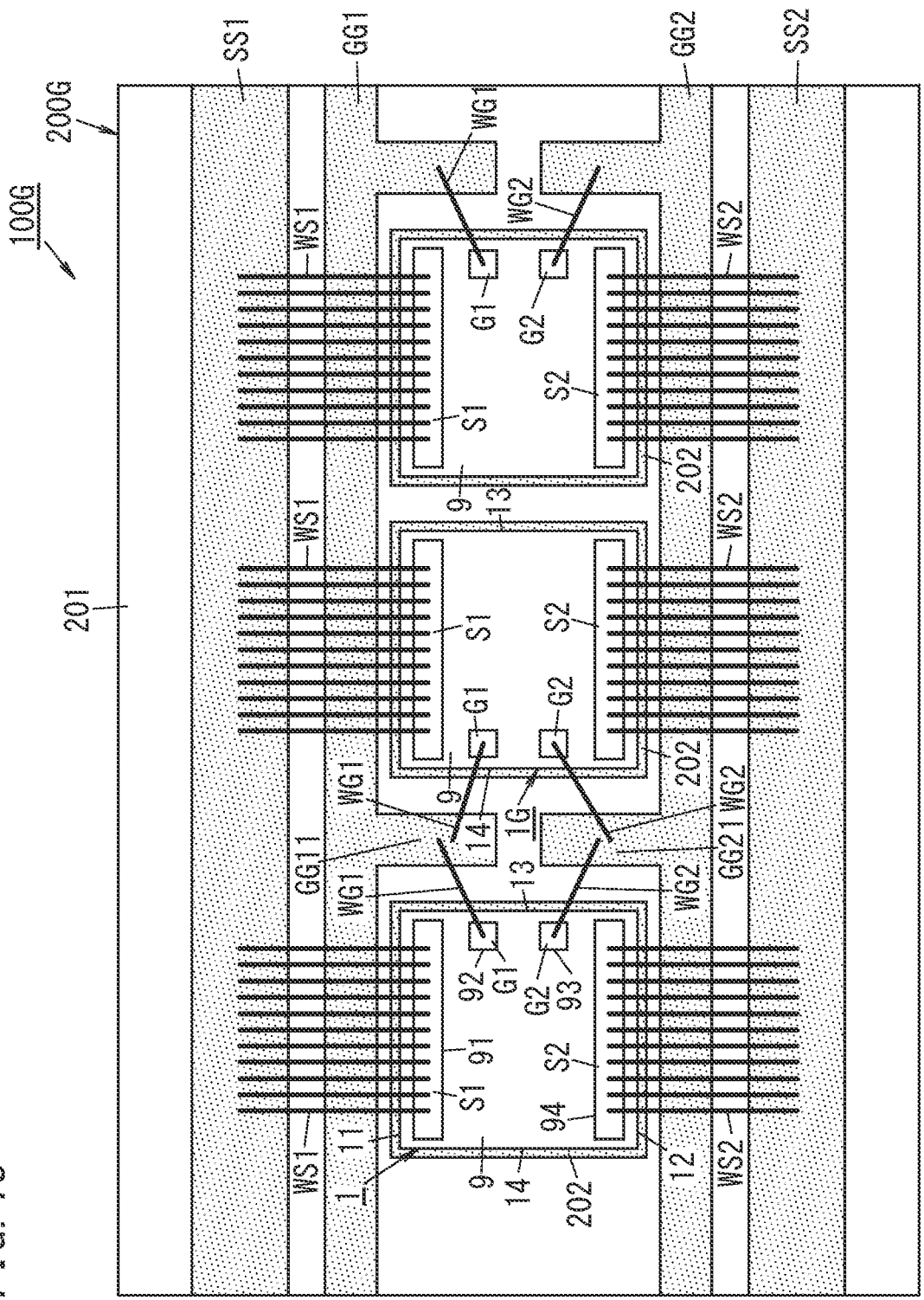
FIG. 13 is a plan view of a bidirectional switch module according to a fifth embodiment.

FIGS. 1 and 13 to be referred to in the following description of embodiments and their variations are all schematic representations. Thus, the ratio of the dimensions (including thicknesses) of respective constituent elements illustrated in FIGS. 1 and 13 does not always reflect their actual dimensional ratio.

First Embodiment

Figure 2:
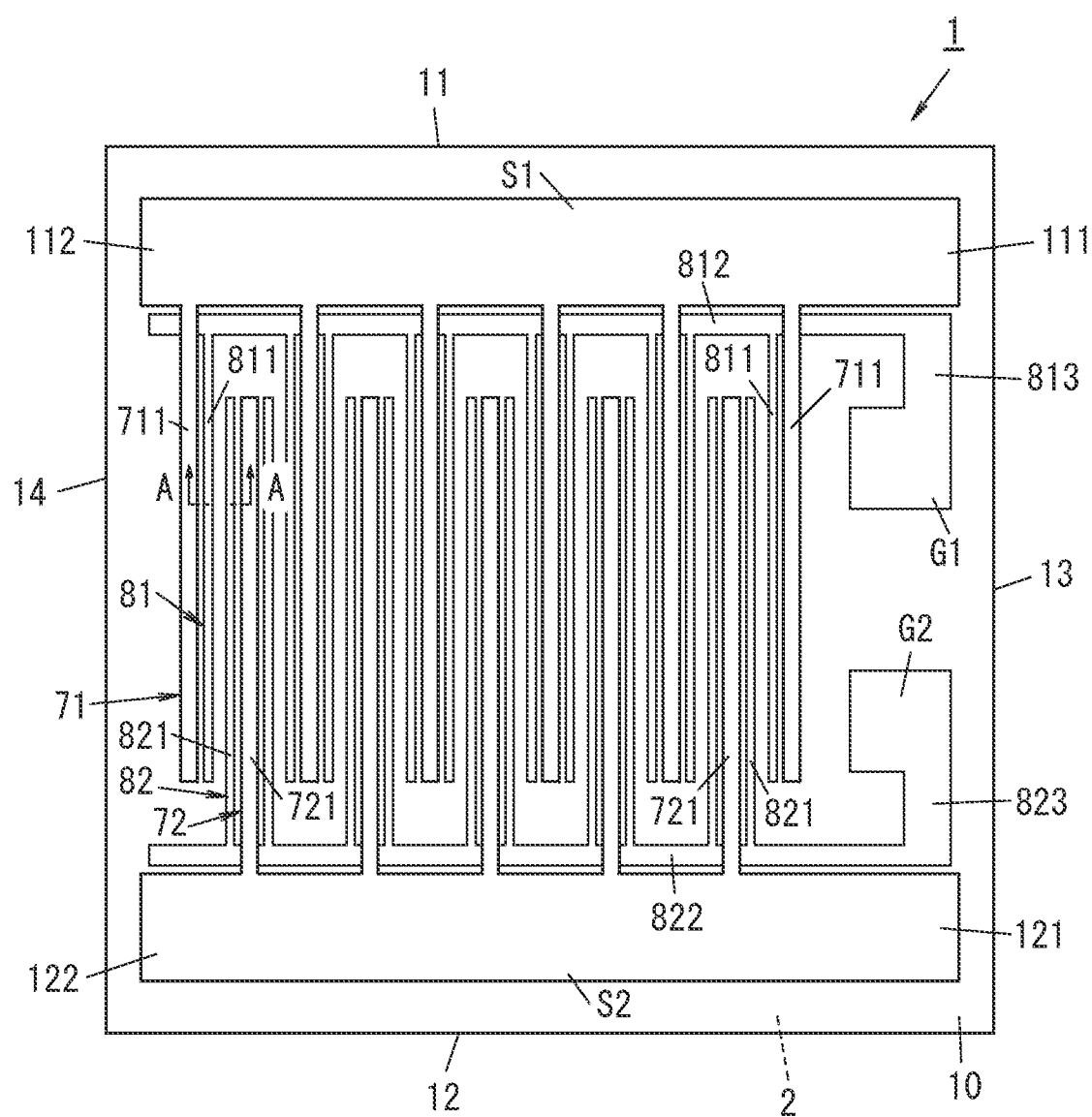
FIG. 2 illustrates a layout in a plan view for each bidirectional switch included in the bidirectional switch module.
Figure 3:
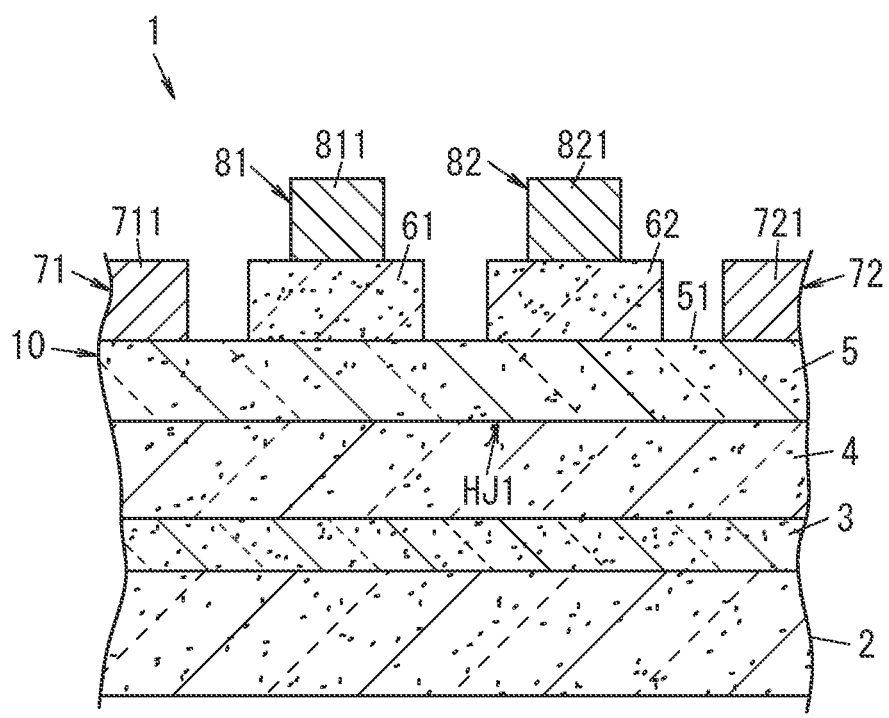
FIG. 3 is a cross-sectional view of each bidirectional switch included in the bidirectional switch module as taken along the plane A-A shown in FIG. 2.

A bidirectional switch module 100 according to a first embodiment will be described with reference to FIGS. 1-3.
(1) Overview The bidirectional switch module 100 includes a plurality of (e.g., three) bidirectional switches 1 and a mount board 200 as shown in FIG. 1. Each of the plurality of bidirectional switches 1 includes a first source electrode 71, a first gate electrode 81, a second gate electrode 82, and a second source electrode 72 as shown in FIGS. 2 and 3. The plurality of bidirectional switches 1 are mounted on the mount board 200 as shown in FIG. 1. In this embodiment, the mount board 200 includes, for example, a plurality of die pad portions 202 associated one to one with the plurality of bidirectional switches 1. Each of the plurality of bidirectional switches 1 is mounted on an associated one of the plurality of die pad portions 202. Mounting each of the plurality of bidirectional switches 1 on an associated one of the plurality of die pad portions 202 allows the bidirectional switch 1 to be bonded to the die pad portion 202. A bonding portion that bonds the bidirectional switch 1 and the die pad portion 202 is made of a die bonding material such as solder or electrically conductive paste. In the bidirectional switch module 100, the plurality of bidirectional switches 1 are connected in parallel.

(2) Constituent Elements of Bidirectional Switch Module

Next, the respective constituent elements of the bidirectional switch module 100 will be described in further detail.
(2.1.1) Bidirectional Switch The bidirectional switch 1 includes, for example, a substrate 2, a first nitride semiconductor layer 4, a second nitride semiconductor layer 5, the first source electrode 71, the first gate electrode 81, the second gate electrode 82, and the second source electrode 72 as shown in FIG. 3. In addition, the bidirectional switch 1 further includes a first p-type layer 61 and a second p-type layer 62.

The bidirectional switch 1 is a dual-gate GaN-based gate injection transistor (GIT). The substrate 2 may be a silicon substrate, for example, and has electrical conductivity. The first nitride semiconductor layer 4 may be a GaN layer, for example. The second nitride semiconductor layer 5 may be an AlGaN layer, for example. The first p-type layer 61 may be a p-type AlGaN layer, for example. The second p-type layer 62 may be a p-type AlGaN layer, for example. The p-type AlGaN layer, serving as each of the first p-type layer 61 and the second p-type layer 62, may, but does not have to, have the same Al composition ratio (of 0.2, for example) as the AlGaN layer serving as the second nitride semiconductor layer 5. As used herein, the Al composition ratio refers to an x value when the p-type AlGaN layer is expressed by the general formula $Al_xGa_{1-x}N$ and is the molar ratio of Al to the sum of Al and Ga. Each of the first p-type layer 61 and the second p-type layer 62 does not have to be a p-type AlGaN layer but may also be a p-type GaN layer, for example.

When viewed in plan in the thickness direction defined with respect to the substrate 2, the substrate 2 may have a square outer peripheral shape, for example. However, this is only an example and should not be construed as limiting. Alternatively, the substrate 2 may also have a rectangular outer peripheral shape in a plan view.

The substrate 2 is electrically insulated from all of the first source electrode 71, the second source electrode 72, the first gate electrode 81, and the second gate electrode 82.

The first nitride semiconductor layer 4 is formed over the substrate 2. The second nitride semiconductor layer 5 is formed on the first nitride semiconductor layer 4. The second nitride semiconductor layer 5 has a larger bandgap than the first nitride semiconductor layer 4. The first source electrode 71 is formed on the second nitride semiconductor layer 5. The first gate electrode 81 is formed over the second nitride semiconductor layer 5 and spaced from the first source electrode 71. The second gate electrode 82 is also formed over the second nitride semiconductor layer 5 and spaced from the first gate electrode 81. The second source electrode 72 is formed on the second nitride semiconductor layer 5 and spaced from the second gate electrode 82. The first p-type layer 61 is interposed between the first gate electrode 81 and the second nitride semiconductor layer 5. The second p-type layer 62 is interposed between the second gate electrode 82 and the second nitride semiconductor layer 5. In this bidirectional switch 1, a multi-layer stack 10 including the first nitride semiconductor layer 4, the second nitride semiconductor layer 5, the first p-type layer 61, and the second p-type layer 62 is formed on the substrate 2.

In the bidirectional switch 1, the second nitride semiconductor layer 5 forms, along with the first nitride semiconductor layer 4, a heterojunction HJ1. In a region, located near the heterojunction HJ1, of the first nitride semiconductor layer 4, a two-dimensional electron gas has been produced. The region including the two-dimensional electron gas (hereinafter also referred to as a "two-dimensional electron gas layer") may serve as an n-channel layer (electron conduction layer).

The first nitride semiconductor layer 4 is formed over the substrate 2 with a buffer layer 3 interposed between them. In this embodiment, the multi-layer stack 10 includes the buffer layer 3. In this multi-layer stack 10, the buffer layer 3, the first nitride semiconductor layer 4, and the second nitride semiconductor layer 5 are arranged in this order such that the buffer layer 3 is located closer to the substrate 2 than any other layer of the multi-layer stack 10 is. In addition, the multi-layer stack 10 further includes the first p-type layer 61 and the second p-type layer 62 that are formed on the second nitride semiconductor layer 5. The buffer layer 3 may be an undoped GaN layer, for example. The GaN layer serving as the first nitride semiconductor layer 4 may be an undoped GaN layer, for example. The AlGaN layer serving as the second nitride semiconductor layer 5 may be an undoped AlGaN layer, for example. Each of the buffer layer 3, the first nitride semiconductor layer 4, and the second nitride semiconductor layer 5 may include Mg, H, Si, C, O, and other impurities to be inevitably contained therein during their growth by metalorganic vapor phase epitaxy (MOVPE) process, for example.

The first p-type layer 61 and the second p-type layer 62 cover the surface 51 of the second nitride semiconductor layer 5 only partially. Thus, the surface 51 of the second nitride semiconductor layer 5 includes regions covered with the first p-type layer 61 and the second p-type layer 62 and regions covered with neither the first p-type layer 61 nor the second p-type layer 62. The first p-type layer 61 and the second p-type layer 62 are spaced apart from each other.

The first source electrode 71 and the second source electrode 72 are formed on the regions, covered with neither the first p-type layer 61 nor the second p-type layer 62, of the surface 51 of the second nitride semiconductor layer 5. The first source electrode 71 and the second source electrode 72 are spaced from each other. The first source electrode 71 and the second source electrode 72 are electrically connected to the heterojunction HJ1. As used herein, if two members are "electrically connected," this phrase means that the two members are in ohmic contact with each other. Each of the first source electrode 71 and the second source electrode 72 includes Ti and Al, for example.

The first gate electrode 81 is provided over the second nitride semiconductor layer 5 with the first p-type layer 61 interposed between themselves. Likewise, the second gate electrode 82 is provided over the second nitride semiconductor layer 5 with the second p-type layer 62 interposed between themselves. The first gate electrode 81 and the second gate electrode 82 make ohmic contact with the first p-type layer 61 and the second p-type layer 62, respectively. Each of the first gate electrode 81 and the second gate electrode 82 includes Pd and Au, for example.

The substrate 2 may have a thickness falling within the range from 100 μm to 1000 μm, for example. The buffer layer 3 may have a thickness falling within the range from 100 nm to 3000 nm, for example. The first nitride semiconductor layer 4 may have a thickness falling within the range from 100 nm to 700 nm, for example. The second nitride semiconductor layer 5 may have a thickness falling within the range from 20 nm to 100 nm, for example. The first p-type layer 61 and second p-type layer 62 may each have a thickness falling within the range from 50 nm to 300 nm.

In the bidirectional switch 1, as shown in FIG. 2, the first source electrode 71 includes a plurality of (e.g., six in the example illustrated in FIG. 2) first source electrode comb teeth 711. The first gate electrode 81 includes a plurality of (e.g., ten in the example illustrated in FIG. 2) first gate electrode comb teeth 811. The second gate electrode 82 includes a plurality of (e.g., ten in the example illustrated in FIG. 2) second gate electrode comb teeth 821. The second source electrode 72 includes a plurality of (e.g., five in the example illustrated in FIG. 2) second source electrode comb teeth 721.

The plurality of first source electrode comb teeth 711 and the plurality of second source electrode comb teeth 721 are alternately arranged one by one. Between each pair of a first source electrode comb tooth 711 and a second source electrode comb tooth 721 which are adjacent to each other, one first gate electrode comb tooth 811, out of the plurality of first gate electrode comb teeth 811, and one second gate electrode comb tooth 821, out of the plurality of second gate electrode comb teeth 821, are arranged side by side in this order from the first source electrode comb tooth 711 toward the second source electrode comb tooth 721. In the following description, the direction in which the first source electrode comb teeth 711, the first gate electrode comb teeth 811, and the second gate electrode comb teeth 821 are arranged side by side in a plan view of the bidirectional switch 1 will be hereinafter referred to as a "predetermined direction."

Each pair of a first gate electrode comb tooth 811 and a second gate electrode comb tooth 821 which are adjacent to each other in the predetermined direction are spaced apart from each other. The distance between the first gate electrode comb tooth 811 and second gate electrode comb tooth 821 that are adjacent to each other in the predetermined direction is longer than the distance between the first p-type layer 61 and the second p-type layer 62 that are adjacent to each other in the predetermined direction. The first gate electrode comb tooth 811 and the first source electrode comb tooth 711 that are adjacent to each other in the predetermined direction are spaced apart from each other. The second gate electrode comb tooth 821 and the second source electrode comb tooth 721 that are adjacent to each other in the predetermined direction are also spaced apart from each other.

The bidirectional switch 1 further includes a first source electrode pad S1, a first gate electrode pad G1, a second source electrode pad S2, and a second gate electrode pad G2.

The first source electrode pad S1 is electrically connected to the plurality of first source electrode comb teeth 711. The first source electrode pad S1 has an elongate (straight) shape which is elongated in the predetermined direction. The first source electrode pad S1 is connected to the plurality of first source electrode comb teeth 711 at one end in the latitudinal direction (i.e., in the width direction) defined therefor. Thus, in this bidirectional switch 1, the combination of the first source electrode pad S1 and the plurality of first source electrode comb teeth 711 defines a comb shape. The latitudinal direction defined for the first source electrode pad S1 is a direction perpendicular to the predetermined direction in a plan view of the bidirectional switch 1. The first source electrode pad S1 has a first end 111 and a second end 112 in the longitudinal direction.

The first gate electrode pad G1 faces the first end 111 of the first source electrode pad S1 in the direction perpendicular to the predetermined direction.

The first gate electrode pad G1 is electrically connected to the plurality of first gate electrode comb teeth 811 of the first gate electrode 81. In this embodiment, the first gate electrode 81 includes a first gate electrode comb bone 812 connected to the plurality of first gate electrode comb teeth 811. The first gate electrode comb bone 812 has an elongate (straight) shape which is elongated in the predetermined direction. Thus, in this bidirectional switch 1, the first gate electrode 81 including the first gate electrode comb bone 812 and the plurality of first gate electrode comb teeth 811 has a comb shape. The first gate electrode comb bone 812 is adjacent to the first source electrode pad S1 when the bidirectional switch 1 is viewed in plan in the thickness direction. The first gate electrode comb bone 812 is located in a different layer from the plurality of first source electrode comb teeth 711 in the thickness direction defined for the bidirectional switch 1 and is out of contact with the plurality of first source electrode comb teeth 711. In other words, an insulating layer with electrical insulation properties (such as an interlevel insulating film) is interposed between the first gate electrode comb bone 812 and the plurality of first source electrode comb teeth 711 in the thickness direction defined for the bidirectional switch 1.

The first gate electrode pad G1 is electrically connected to the plurality of first gate electrode comb teeth 811 via a wiring portion 813, which extends from the first gate electrode pad G1 toward the first source electrode pad S1, and the first gate electrode comb bone 812. The first gate electrode pad G1 may have, for example, a square shape in a plan view. However, this is only an example and should not be construed as limiting. Alternatively, the first gate electrode pad G1 may also have a rectangular shape in a plan view. When measured in the predetermined direction, the length of the first gate electrode pad G1 is shorter than that of the first source electrode pad S1.

The second source electrode pad S2 is electrically connected to the plurality of second source electrode comb teeth 721. The second source electrode pad S2 has an elongate (straight) shape which is elongated in the predetermined direction. The second source electrode pad S2 is connected to the plurality of second source electrode comb teeth 721 at one end in the latitudinal direction (i.e., in the width direction) defined therefor. Thus, in this bidirectional switch 1, the combination of the second source electrode pad S2 and the plurality of second source electrode comb teeth 721 defines a comb shape. The latitudinal direction defined for the second source electrode pad S2 is a direction perpendicular to the predetermined direction in a plan view of the bidirectional switch 1. The second source electrode pad S2 has a first end 121 and a second end 122 in the longitudinal direction.

The second gate electrode pad G2 faces the first end 121 of the second source electrode pad S2 in the direction perpendicular to the predetermined direction.

The second gate electrode pad G2 is electrically connected to the plurality of second gate electrode comb teeth 821 of the second gate electrode 82. In this embodiment, the second gate electrode 82 includes a second gate electrode comb bone 822 connected to the plurality of second gate electrode comb teeth 821. The second gate electrode comb bone 822 has an elongate (straight) shape which is elongated in the predetermined direction. Thus, in this bidirectional switch 1, the second gate electrode 82 including the second gate electrode comb bone 822 and the plurality of second gate electrode comb teeth 821 has a comb shape. The second gate electrode comb bone 822 is adjacent to the second source electrode pad S2 when the bidirectional switch 1 is viewed in plan in the thickness direction. The second gate electrode comb bone 822 is located in a different layer from the plurality of second source electrode comb teeth 721 in the thickness direction defined for the bidirectional switch 1 and is out of contact with the plurality of second source electrode comb teeth 721. In other words, an insulating layer with electrical insulation properties (such as an interlevel insulating film) is interposed between the second gate electrode comb bone 822 and the plurality of second source electrode comb teeth 721 in the thickness direction defined for the bidirectional switch 1.

The second gate electrode pad G2 is electrically connected to the plurality of second gate electrode comb teeth 821 via a wiring portion 823, which extends from the second gate electrode pad G2 toward the second source electrode pad S2, and the second gate electrode comb bone 822. The second gate electrode pad G2 may have a square shape in a plan view. However, this is only an example and should not be construed as limiting. Alternatively, the second gate electrode pad G2 may also have a rectangular shape in a plan view. When measured in the predetermined direction, the length of the second gate electrode pad G2 is shorter than that of the second source electrode pad S2.

The bidirectional switch 1 further includes a passivation film 9 (see FIG. 1). The passivation film 9 covers the first source electrode 71, the first gate electrode 81, the second gate electrode 81, the second source electrode 72, and other members on the surface 51 of the second nitride semiconductor layer 5. In addition, as shown in FIG. 1, the passivation film 9 has a plurality of (e.g., four in this example) openings 91-94 which are respectively provided one to one for the first source electrode pad S1, the first gate electrode pad G1, the second gate electrode pad G2, and the second source electrode pad S2 to expose the first source electrode pad S1, the first gate electrode pad G1, the second gate electrode pad G2, and the second source electrode pad S2.

When viewed in plan in the thickness direction defined for the bidirectional switch 1, the outer peripheral shape of the bidirectional switch 1 is substantially the same as the outer peripheral shape of the substrate 2. The outer peripheral shape of the bidirectional switch 1 may be square, for example. However, this is only an example and should not be construed as limiting. Alternatively, the outer peripheral shape of the bidirectional switch 1 may also be rectangular, for example.

As shown in FIG. 2, the bidirectional switch 1 has a first side 11 and a second side 12 which are parallel to each other in a plan view and a third side 13 and a fourth side 14 which are parallel to each other in a plan view. The angle formed between the first side 11 and each of the third side 13 and the fourth side 14 and the angle formed between the second side 12 and each of the third side 13 and the fourth side 14 are both 90 degrees. In the bidirectional switch 1, the profile along the outer periphery of the passivation film 9, the multi-layer stack 10, or the substrate 2 in a plan view has the first to fourth sides 11-14.

The first source electrode pad S1 is arranged along the first side 11. The second source electrode pad S2 is arranged along the second side 12. The first gate electrode pad G1 and the second gate electrode pad G2 are arranged along the third side 13. In a direction aligned with the third side 13, (the first end 111 of) the first source electrode pad S1, the first gate electrode pad G1, the second gate electrode pad G2, and (the first end 121 of) the second source electrode pad S2 are arranged side by side in this order. In the bidirectional switch 1, the first end 111 of the first source electrode pad S1, the second end 112 of the first source electrode pad S1, the first end 121 of the second source electrode pad S2, and the second end 122 of the second source electrode pad S2 are respectively located at the four corners thereof in a plan view.

(2.1.2) Operation of Bidirectional Switch

In the following description, a state where a voltage equal to or greater than a first threshold value (of 1.3 V, for example) is not applied between the first gate electrode 81 and the first source electrode 71 will be hereinafter referred to as a state where "the first gate electrode 81 is in OFF state" for the sake of convenience. On the other hand, a state where a voltage equal to or greater than the first threshold value is applied between the first gate electrode 81 and the first source electrode 71 with the first gate electrode 81 having the higher potential will be hereinafter referred to as a state where "the first gate electrode 81 is in ON state." Also, a state where a voltage equal to or greater than a second threshold value (of 1.3 V, for example) is not applied between the second gate electrode 82 and the second source electrode 72 will be hereinafter referred to as a state where "the second gate electrode 82 is in OFF state." On the other hand, a state where a voltage equal to or greater than the second threshold value is applied between the second gate electrode 82 and the second source electrode 72 with the second gate electrode 82 having the higher potential will be hereinafter referred to as a state where "the second gate electrode 82 is in ON state."

The bidirectional switch 1 includes the first p-type layer 61 and the second p-type layer 62 described above, and thereby is implemented as a normally OFF type transistor. In this embodiment, the transistor is a lateral transistor. When the first gate electrode 81 is in OFF state, the first p-type layer 61 forms a depletion layer right under the first p-type layer 61 itself and between the second nitride semiconductor layer 5 and the first nitride semiconductor layer 4. When the second gate electrode 82 is in OFF state, the second p-type layer 62 forms a depletion layer right under the second p-type layer 62 itself and between the second nitride semiconductor layer 5 and the first nitride semiconductor layer 4. When the first gate electrode 81 is in ON state, the bidirectional switch 1 may connect the first gate electrode comb teeth 811 and the first source electrode comb teeth 711 together with a two-dimensional electron gas layer. In other words, in the bidirectional switch 1, the two-dimensional electron gas layer is not interrupted by the depletion layer between the first gate electrode comb teeth 811 and the first source electrode comb teeth 711 when the first gate electrode 81 is in the ON state. In addition, when the second gate electrode 82 is in ON state, the bidirectional switch 1 may connect the second gate electrode comb teeth 821 and the second source electrode comb teeth 721 together with the two-dimensional electron gas layer. In other words, in the bidirectional switch 1, the two-dimensional electron gas layer is not interrupted by the depletion layer between the second gate electrode comb teeth 821 and the second source electrode comb teeth 721 when the second gate electrode 82 is in ON state.

When the first gate electrode 81 is in OFF state and the second gate electrode 82 is in OFF state (i.e., in a first operation mode), the bidirectional switch 1 allows no current to flow in any direction between the first source electrode 71 and the second source electrode 72. More specifically, in the first operation mode, when the first source electrode 71 has a higher potential than the second source electrode 72, a current flowing from the first source electrode 71 toward the second source electrode 72 is interrupted. In addition, when the second source electrode 72 has a higher potential than the first source electrode 71, a current flowing from the second source electrode 72 toward the first source electrode 71 is interrupted.

When the first gate electrode 81 is in ON state and the second gate electrode 82 is in ON state (i.e., in a second operation mode), the bidirectional switch 1 allows a current to flow bidirectionally between the first source electrode 71 and the second source electrode 72. More specifically, in the second operation mode, when the first source electrode 71 has a higher potential than the second source electrode 72, a current flows from the first source electrode 71 toward the second source electrode 72. In addition, when the second source electrode 72 has a higher potential than the first source electrode 71, a current flows from the second source electrode 72 toward the first source electrode 71.

When the first gate electrode 81 is in ON state and the second gate electrode 82 is in OFF state (i.e., in a third operation mode), the bidirectional switch 1 serves as a diode. More specifically, in the third operation mode, when the first source electrode 71 has a higher potential than the second source electrode 72, a current flowing from the first source electrode 71 toward the second source electrode 72 is interrupted. In addition, when the second source electrode 72 has a potential higher by at least a second threshold voltage than the first source electrode 71, a current flows from the second source electrode 72 toward the first source electrode 71.

When the first gate electrode 81 is in OFF state and the second gate electrode 82 is in ON state (i.e., in a fourth operation mode), the bidirectional switch 1 serves as a diode. More specifically, in the fourth operation mode, when the second source electrode 72 has a higher potential than the first source electrode 71, a current flowing from the second source electrode 72 toward the first source electrode 71 is interrupted. In addition, when the first source electrode 71 has a potential higher by at least a first threshold voltage than the second source electrode 72, a current flows from the first source electrode 71 toward the second source electrode 72.

In the bidirectional switch 1 described above, the first threshold voltage and the second threshold voltage have the same value. Alternatively, the first threshold voltage and the second threshold voltage may also have different values. The first threshold voltage herein refers to a threshold voltage at which a current is allowed to flow through the two-dimensional electron gas layer due to shrinkage of the depletion layer that expands to interrupt the two-dimensional electron gas layer under the first gate electrode comb teeth 811 of the first gate electrode 81. The second threshold voltage herein refers to a threshold voltage at which a current is allowed to flow through the two-dimensional electron gas layer due to shrinkage of the depletion layer that expands to interrupt the two-dimensional electron gas layer under the second gate electrode comb teeth 821 of the second bonding portion 82.

(2.2) Mount Board

The mount board 200 includes an insulating substrate 201, a first source line portion SS1, a first gate line portion GG1, a second gate line portion GG2, and a second source line portion SS2 as shown in FIG. 1.

The insulating substrate 201 may be, but does not have to be, a ceramic substrate such as an aluminum nitride substrate, an alumina substrate, or a silicon nitride substrate, for example. When viewed in the thickness direction defined for the insulating substrate 201, the insulating substrate 201 may, but does not have to, have a rectangular outer peripheral shape.

The first source line portion SS1, the first gate line portion GG1, the second gate line portion GG2, and the second source line portion SS2 are arranged on the insulating substrate 201 and all extend in the direction in which the plurality of bidirectional switches 1 are arranged side by side. Each of the first source line portion SS1, the first gate line portion GG1, the second gate line portion GG2, and the second source line portion SS2 has an elongate (straight) shape. Each of the first source line portion SS1, the first gate line portion GG1, the second gate line portion GG2, and the second source line portion SS2 is arranged such that its longitudinal axis is aligned with the direction in which the plurality of bidirectional switches 1 are arranged side by side. Each of the first source line portion SS1 and the second source line portion SS2 suitably has a broader line width than each of the first gate line portion GG1 and the second gate line portion GG2.

On the mount board 200, the first source line portion SS1, the first gate line portion GG1, the second gate line portion GG2, and the second source line portion SS2 are arranged side by side in this order in a plan view. In this embodiment, the plurality of bidirectional switches 1 are provided between, and out of contact with, the first gate line portion GG1 and the second gate line portion GG2.

In addition, the mount board 200 further includes a plurality of (e.g., three) first gate line extensions GG11 and a plurality of (e.g., three) second gate line extensions GG21.

The plurality of first gate line extensions GG11 extends from the first gate line portion GG1 toward the second gate line portion GG2. The length of each of the plurality of first gate line extensions GG11 is shorter than a half of the distance between the first gate line portion GG1 and the second gate line portion GG2.

The plurality of second gate line extensions GG21 extends from the second gate line portion GG2 toward the first gate line portion GG1. The length of each of the plurality of second gate line extensions GG21 is shorter than a half of the distance between the first gate line portion GG1 and the second gate line portion GG2.

The plurality of first gate line extensions GG11 are associated one to one with the plurality of bidirectional switches 1. Each of the plurality of first gate line extensions GG11 is adjacent to (the third side 13 of) an associated one of the plurality of bidirectional switches 1. In this embodiment, between a first gate line extension GG11 and a bidirectional switch 1 that are associated one to one with each other, the first gate line extension GG11 is electrically connected to the first gate electrode pad G1 of the bidirectional switch 1 via a connection member (first gate wire WG1).

The plurality of second gate line extensions GG21 are associated one to one with the plurality of bidirectional switches 1. Each of the plurality of second gate line extensions GG21 is adjacent to (the third side 13 of) an associated one of the plurality of bidirectional switches 1. In this embodiment, between a second gate line extension GG21 and a bidirectional switch 1 that are associated one to one with each other, the second gate line extension GG21 is electrically connected to the second gate electrode pad G2 of the bidirectional switch 1 via a connection member (second gate wire WG2).

On the mount board 200, the plurality of first gate line extensions GG11 and the plurality of second gate line extensions GG21 correspond one to one, and each of the first gate line extensions GG11 and a corresponding one of the second gate line extensions GG21 are arranged such that their respective tips face each other.

On the mount board 200, the first gate line portion GG1 and the second gate line portion GG2 are arranged to be symmetric to each other in a plan view with respect to a center line aligned with the longitudinal direction, and the first source line portion SS1 and the second source line portion SS2 are also arranged to be symmetric to each other in a plan view with respect to the center line. In addition, on the mount board 200, the plurality of first gate line extensions GG11 and the plurality of second gate line extensions GG21 are also arranged to be symmetric to each other in a plan view with respect to the center line.

(2.3) Other Constituent Elements of Bidirectional Switch Module

The bidirectional switch module 100 further includes first source wires WS1, first gate wires WG1, second gate wires WG2, and second source wires WS2.

Each of the first source wires WS1, the first gate wires WG1, the second gate wires WG2, and the second source wires WS2 is a bonding wire.

Each of the first source wires WS1 electrically connects the first source electrode 71 of an associated one of the bidirectional switches 1 to the first source line portion SS1 of the mount board 200. More specifically, each first source wire WS1 electrically connects the first source electrode pad S1 connected to its associated first source electrode 71 to the first source line portion SS1. The bidirectional switch module 100 provides, for each bidirectional switch 1, a plurality of (e.g., eleven in the example illustrated in FIG. 1) first source wires WS1 to connect the first source electrode pad S1 of the bidirectional switch 1 to the first source line portion SS1. The plurality of first source wires WS1 have substantially the same length.

Each of the first gate wires WG1 electrically connects the first gate electrode 81 of an associated one of the bidirectional switches 1 to the first gate line portion GG1. More specifically, each first gate wire WG1 electrically connects the first gate electrode pad G1 connected to its associated first gate electrode 81 to an associated one of the first gate line extensions GG11 extended from the first gate line portion GG1. The bidirectional switch module 100 provides, for each bidirectional switch 1, a single first gate wire WG1 to connect the first gate electrode pad G1 of the bidirectional switch 1 to the associated first gate line extension GG11. The first gate wires WG1 are shorter than the first source wires WS1.

Each of the second gate wires WG2 electrically connects the second gate electrode 82 of an associated one of the bidirectional switches 1 to the second gate line portion GG2. More specifically, each second gate wire WG2 electrically connects the second gate electrode pad G2 connected to its associated second gate electrode 82 to an associated one of the second gate line extensions GG21 extended from the second gate line portion GG2. The bidirectional switch module 100 provides, for each bidirectional switch 1, a single second gate wire WG2 to connect the second gate electrode pad G2 of the bidirectional switch 1 to the associated second gate line extension GG21. The second gate wires WG2 have substantially the same length as the first gate wires WG1.

Each of the second source wires WS2 electrically connects the second source electrode 72 of an associated one of the bidirectional switches 1 to the second source line portion SS2 of the mount board 200. More specifically, each second source wire WS2 electrically connects the second source electrode pad S2 connected to its associated second source electrode 72 to the second source line portion SS2. The bidirectional switch module 100 provides, for each bidirectional switch 1, a plurality of (e.g., eleven in the example illustrated in FIG. 1) second source wires WS2 to connect the second source electrode pad S2 of the bidirectional switch 1 to the second source line portion SS2. The plurality of second source wires WS2 have substantially the same length. The second source wires WS2 have substantially the same length as the first source wires WS1.

Optionally, the bidirectional switch module 100 may further include a resin layer that encapsulates the plurality of bidirectional switches 1 on the mount board 200. In this case, the resin layer has electrical insulation properties. The resin layer may be made of, for example, an epoxy resin containing a black pigment and has opacity. Alternatively, the mount board 200 may form part of a package that houses the plurality of bidirectional switches 1 therein.

(3) Advantages

A bidirectional switch module 100 according to the first embodiment includes a plurality of bidirectional switches 1 and a mount board 200. Each of the plurality of bidirectional switches 1 includes a first source electrode 71, a first gate electrode 81, a second gate electrode 82, and a second source electrode 72. On the mount board 200, the plurality of bidirectional switches 1 are mounted. In the bidirectional switch module 100, the plurality of bidirectional switches 1 are connected in parallel.

According to this configuration, the bidirectional switch module 100 according to the first embodiment includes the plurality of bidirectional switches 1 that are connected in parallel, and therefore, enables a larger amount of current to flow through itself, thus contributing to meeting the demands for further increasing the amount of current to supply.

In addition, in the bidirectional switch module 100 according to the first embodiment, the plurality of bidirectional switches 1 are mounted as bare chips on the single mount board 200, thus enabling a larger amount of current to flow through itself while reducing its overall size.

Furthermore, the bidirectional switch module 100 according to the first embodiment may make the first gate wires WG1 approximately as long as the second gate wires WG2, thus reducing the chances of one of a first gate signal supplied to the first gate electrode pad G1 of a bidirectional switch 1 or a second gate signal supplied to the second gate electrode pad G2 thereof being delayed with respect to the other. This may contribute to increasing the switching rate.

Furthermore, in the bidirectional switch module 100 according to the first embodiment, in a plan view of the mount board 200, the first source line portion SS1, the first gate line portion GG1, the second gate line portion GG2, and the second source line portion SS2 are arranged side by side in this order, and a plurality of bidirectional switches 1 are located between the first gate line portion GG1 and the second gate line portion GG2. Thus, the bidirectional switch module 100 according to the first embodiment may easily reduce the lengths of the first gate wires WG1 and the second gate wires WG2, thus enabling reducing the parasitic inductance of the first gate wires WG1 and the second gate wires WG2.

Furthermore, in the bidirectional switch module 100 according to the first embodiment, the mount board 200 further includes a plurality of first gate line extensions GG11 and a plurality of second gate line extensions GG21. Thus, the bidirectional switch module 100 according to the first embodiment may easily further reduce the lengths of the first gate wires WG1 and the second gate wires WG2, thus enabling further reducing the parasitic inductance of the first gate wires WG1 and the second gate wires WG2.

(First Variation of First Embodiment)

Figure 4:
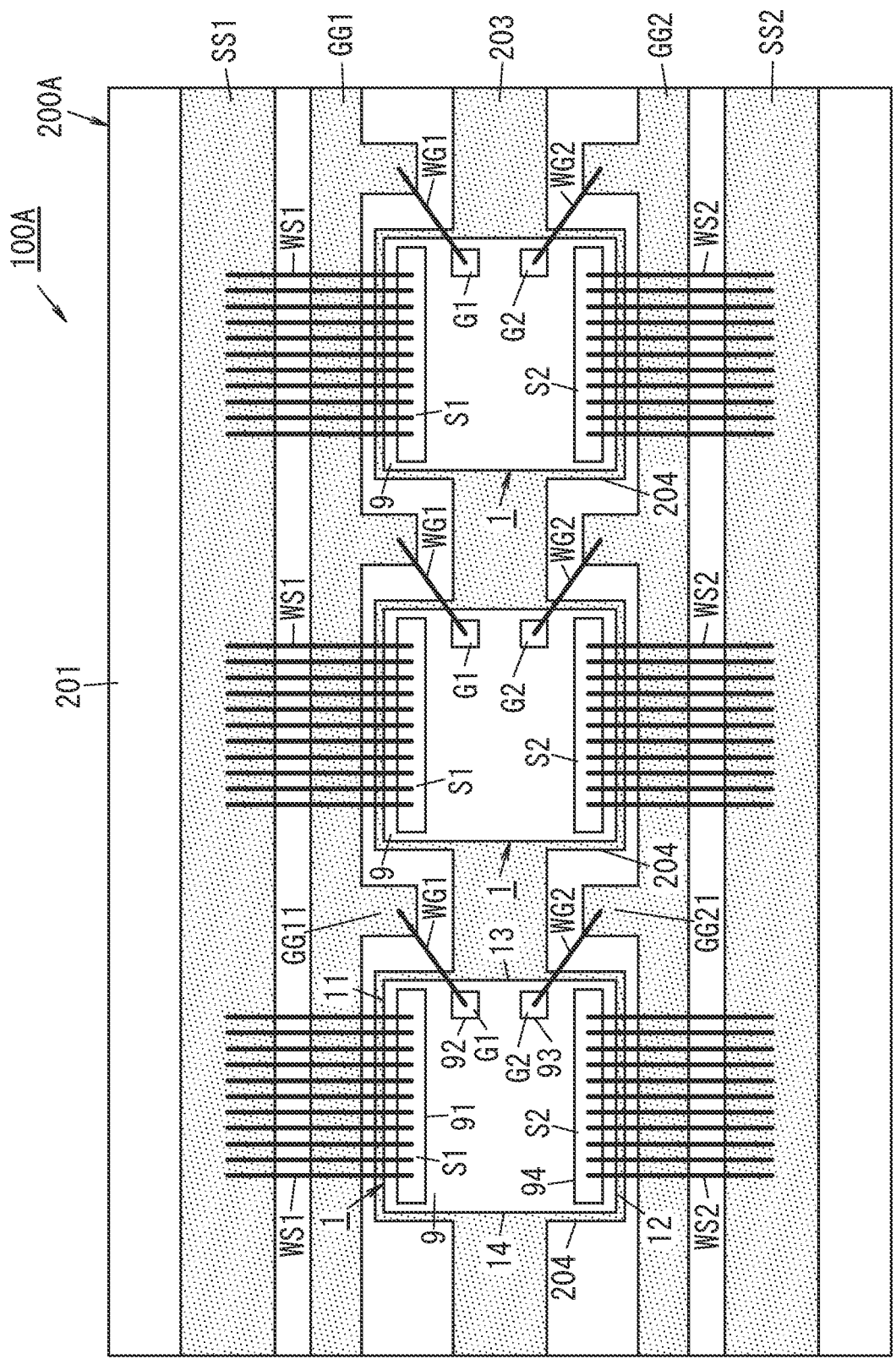
FIG. 4 is a plan view of a bidirectional switch module according to a first variation of the first embodiment.

Next, a bidirectional switch module 100A according to a first variation will be described with reference to FIG. 4.

The bidirectional switch module 100A according to the first variation includes a mount board 200A instead of the mount board 200 of the bidirectional switch module 100 according to the first embodiment, which is a major difference from the bidirectional switch module 100 according to the first embodiment. In the following description, any constituent element of the bidirectional switch module 100A according to this first variation, having the same function as a counterpart of the bidirectional switch module 100 according to the first embodiment described above, will be designated by the same reference numeral as that counterpart's, and description thereof will be omitted as appropriate herein.

The mount board 200A includes a conductor portion 203. To the conductor portion 203, the respective substrates 2 of the plurality of bidirectional switches 1 are electrically connected. The conductor portion 203 includes a plurality of die pad portions 204. The plurality of die pad portions 204 are associated one to one with the plurality of bidirectional switches 1. On each of the plurality of die pad portions 204, an associated one of the bidirectional switches 1 is mounted, thus allowing each die pad portion 204 to be connected both electrically and mechanically to its associated bidirectional switch 1. Note that a bonding portion that bonds each substrate 2 to its associated die pad portion 204 may be made of electrically conductive resin paste including metal particles (in particular, silver paste in which silver particles are dispersed) and is suitably made of sintered silver. However, this is only an example and should not be construed as limiting. Alternatively, the bonding portion may also be made of solder. The sintered silver is a sintered body formed by bonding silver particles together through sintering. The sintered silver is porous silver. Still alternatively, the substrate 2 and the die pad portion 204 may also be bonded together by eutectic bonding or surface activated bonding, for example.

The conductor portion 203 is located on the insulating substrate 201 between, and away from, the first gate line portion GG1 and the second gate line portion GG2. The conductor portion 203 is electrically insulated from the first gate line portion GG1 and the second gate line portion GG2. As for the width of the conductor portion 203 as measured in the direction in which the first gate line portion GG1 and the second gate line portion GG2 are arranged, the line portion, located between the first gate line extensions GG11 and the second gate line extensions GG21, of the conductor portion 203 is narrower than the width of the die pad portions 204. The line portion is spaced apart, and electrically insulated, from the first gate line extensions GG11 and the second gate line extensions GG21.

The bidirectional switch module 100A according to the first variation allows, for example, the substrate 2 of each of the plurality of bidirectional switches 1 to be connected to a constant potential node via the conductor portion 203. This allows the bidirectional switch module 100A according to the first variation to reduce the current collapse compared to a situation where the substrate 2 is allowed to have a floating potential in the bidirectional switch module 100 according to the first embodiment. The constant potential node does not have to be a potential node at which the potential becomes perfectly constant but may also be a potential node which may be regarded as having a substantially constant potential during an ON state period of the bidirectional switch module 100A. The ON state period of the bidirectional switch module 100A is substantially the same as the ON state period of the bidirectional switch 1. The constant potential node may be an output terminal with the lower potential out of a pair of output terminals of a diode bridge included in a rectifier smoothing circuit. The potential at the constant potential node may be a positive potential or a negative potential with respect to the ground. If the constant potential node has negative potential, the current collapse may be reduced as long as the absolute value of the negative potential is equal to or less than a predetermined value (of 150 V, for example). Note that the predetermined value is variable according to the thickness of the substrate 2 of the bidirectional switch 1, the thickness of the multi-layer stack 10 (see FIG. 3), the crystal structure of the multi-layer stack 10, and a difference in crystallinity between the multi-layer stacks 10, for example.

In the bidirectional switch module 100A according to the first variation, the plurality of bidirectional switches 1 are also connected in parallel as in the bidirectional switch module 100 according to the first embodiment, thus contributing to enabling a larger amount of current to flow through itself.

(Second Variation of First Embodiment)

Figure 5:
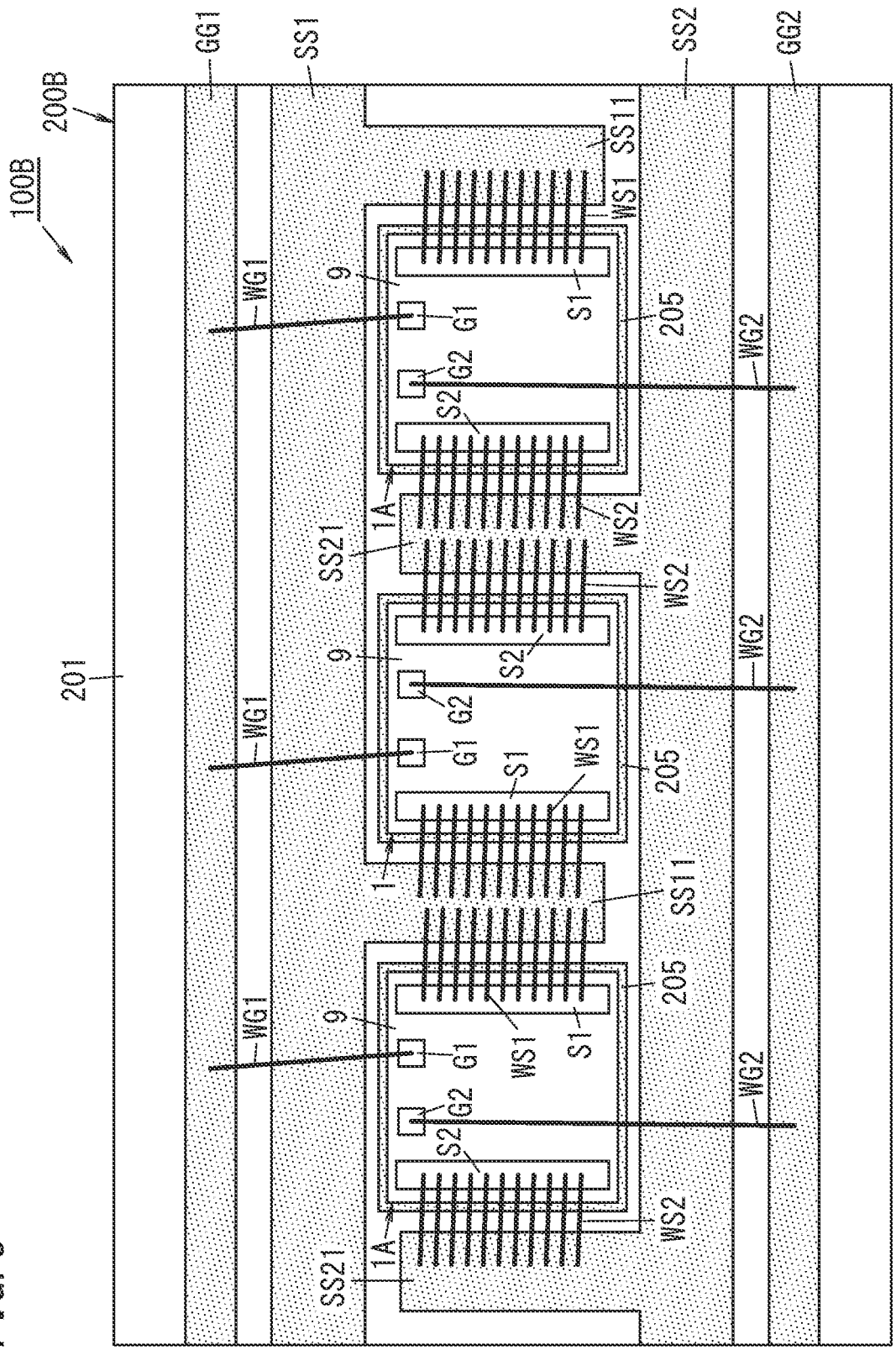
FIG. 5 is a plan view of a bidirectional switch module according to a second variation of the first embodiment.

Next, a bidirectional switch module 100B according to a second variation will be described with reference to FIG. 5.

The bidirectional switch module 100B according to the second variation includes a mount board 200B instead of the mount board 200 of the bidirectional switch module 100 according to the first embodiment, which is a major difference from the bidirectional switch module 100 according to the first embodiment. In the following description, any constituent element of the bidirectional switch module 100B according to this second variation, having the same function as a counterpart of the bidirectional switch module 100 according to the first embodiment described above, will be designated by the same reference numeral as that counterpart's, and description thereof will be omitted as appropriate herein.

On the mount board 200B, the first gate line portion GG1, the first source line portion SS1, the second source line portion SS2, and the second gate line portion GG2 are arranged side by side in this order in a plan view.

In addition, the bidirectional switch module 100B according to the second variation includes two bidirectional switches 1A instead of the two bidirectional switches 1 out of the three bidirectional switches 1 of the bidirectional switch module 100 according to the first embodiment. In each of the two bidirectional switches 1A, the direction in which the first source electrode pad S1, the first gate electrode pad G1, the second gate electrode pad G2, and the second source electrode pad S2 are arranged in a plan view is reversed compared to the bidirectional switch 1. In addition, in each of the two bidirectional switches 1A, the direction in which the first source electrode 71, the first gate electrode 81, the second gate electrode 82, and the second source electrode 72 shown in FIG. 2 are arranged is also reversed compared to the bidirectional switch 1.

Each of the plurality of bidirectional switches 1A, 1, 1A is mounted on an associated one of the plurality of die pad portions 205 of the mount board 200B. The plurality of die pad portions 205 and the plurality of bidirectional switches 1A, 1, 1A are provided between, and out of contact with, the first source line portion SS1 and the second source line portion SS2.

In addition, in the bidirectional switch module 100B according to the second variation, the mount board 200B further includes a plurality of (e.g., two) first source line extensions SS11 and a plurality of (e.g., two) second source line extensions SS21.

The plurality of first source line extensions SS11 extends from the first source line portion SS1 toward the second source line portion SS2.

The plurality of second source line extensions SS21 extends from the second source line portion SS2 toward the first source line portion SS1.

On the mount board 200B, the plurality of first source line extensions SS11 and the plurality of second source line extensions SS21 are alternately arranged one by one.

In the bidirectional switch module 100B according to the second variation, between each pair of a first source line extension SS11 and a second source line extension SS21 which are adjacent to each other among the plurality of first source line extensions SS11 and the plurality of second source line extensions SS21, respectively, one of the plurality of bidirectional switches 1A, 1, 1A is located. In the example illustrated in FIG. 5, a second source line extension SS21, a bidirectional switch 1A, a first source line extension SS11, a bidirectional switch 1, another second source line extension SS21, another bidirectional switch 1A, and another first source line extension SS11 are arranged side by side in this order from left to right.

The plurality of bidirectional switches 1A, 1, 1A are spaced apart from the first source line portion SS1 and the second source line portion SS2 in the direction in which the first source line portion SS1 and the second source line portion SS2 are arranged. In addition, each of the plurality of bidirectional switches 1A, 1, 1A is also spaced apart from its adjacent first source line extension SS11 and second source line extension SS21 in the direction in which the plurality of bidirectional switches 1A, 1, 1A are arranged side by side.

In the bidirectional switch module 100B according to the second variation, the first gate electrode pad G1 of each of the plurality of bidirectional switches 1A, 1, 1A and the first gate line portion GG1 of the mount board 200B are electrically connected together via a first gate wire WG1.

In addition, in the bidirectional switch module 100B according to the second variation, the second gate electrode pad G2 of each of the plurality of bidirectional switches 1A, 1, 1A and the second gate line portion GG2 of the mount board 200B are electrically connected together via a second gate wire WG2.

Furthermore, in the bidirectional switch module 100B according to the second variation, the first source electrode pad S1 of each of the plurality of bidirectional switches 1A, 1, 1A and an associated one of the first source line extensions SS11 of the mount board 200B are electrically connected together via a plurality of first source wires WS1.

Furthermore, in the bidirectional switch module 100B according to the second variation, the second source electrode pad S2 of each of the plurality of bidirectional switches 1A, 1, 1A and an associated one of the second source line extensions SS21 of the mount board 200B are electrically connected together via a plurality of second source wires WS2.

In the bidirectional switch module 100B according to the second variation, the plurality of bidirectional switches 1A, 1, 1A are connected in parallel, thus contributing to enabling a larger amount of current to flow through itself as in the bidirectional switch module 100 according to the first embodiment.

(Third Variation of First Embodiment)

Figure 6:
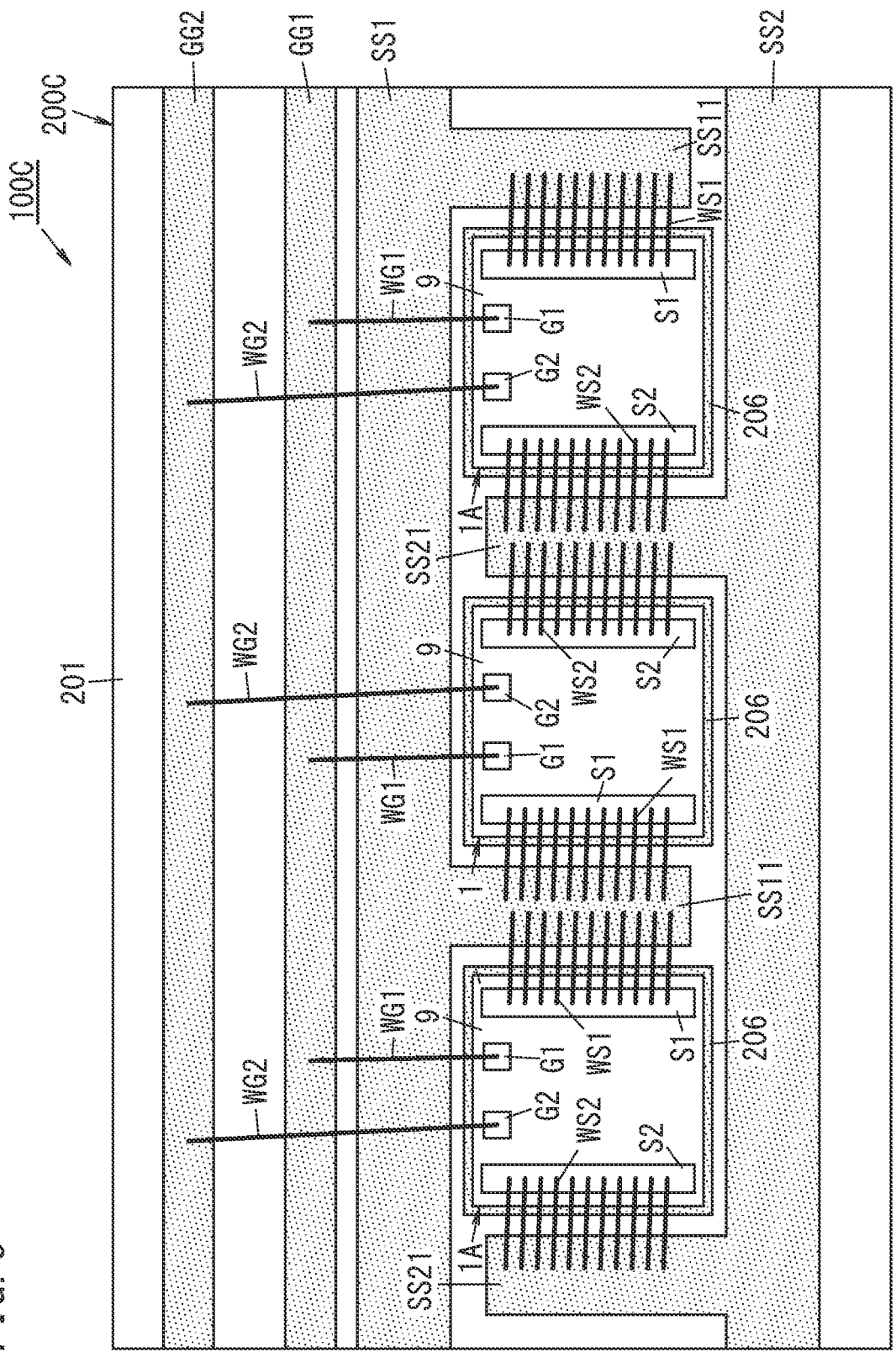
FIG. 6 is a plan view of a bidirectional switch module according to a third variation of the first embodiment.

Next, a bidirectional switch module 100C according to a third variation will be described with reference to FIG. 6.

The bidirectional switch module 100C according to the third variation includes a mount board 200C instead of the mount board 200B of the bidirectional switch module 100B according to the second variation of the first embodiment, which is a major difference from the bidirectional switch module 100B. In the following description, any constituent element of the bidirectional switch module 100C according to this third variation, having the same function as a counterpart of the bidirectional switch module 100B according to the second variation of the first embodiment described above, will be designated by the same reference numeral as that counterpart's, and description thereof will be omitted as appropriate herein.

On the mount board 200C, the second gate line portion GG2 and the first gate line portion GG1 are arranged side by side in a plan view and the first source line portion SS1 and the second source line portion SS2 are arranged side by side in a plan view. The distance between the second gate line portion GG2 and the first gate line portion GG1 is set to be wide enough to ensure a predetermined insulation distance and is longer than the distance between the first gate line portion GG1 and the first source line portion SS1. In this variation, on the mount board 200C, the second gate line portion GG2, the first gate line portion GG1, the first source line portion SS1, and the second source line portion SS2 are arranged side by side in this order. However, this is only an example and should not be construed as limiting. Alternatively, the first gate line portion GG1, the second gate line portion GG2, the first source line portion SS1, and the second source line portion SS2 may be arranged in this order. Still alternatively, the second gate line portion GG2, the first gate line portion GG1, the second source line portion SS2, and the first source line portion SS1 may be arranged in this order.

Each of the plurality of bidirectional switches 1A, 1, 1A is mounted on an associated one of the plurality of die pad portions 205 of the mount board 200C. The plurality of die pad portions 206 and the plurality of bidirectional switches 1A, 1, 1A are provided between, and out of contact with, the first source line portion SS1 and the second source line portion SS2.

In the bidirectional switch module 100C according to the third variation, the plurality of bidirectional switches 1A, 1, 1A are connected in parallel, thus contributing to enabling a larger amount of current to flow through itself as in the bidirectional switch module 100B according to the second variation of the first embodiment.

Second Embodiment

Figure 7:
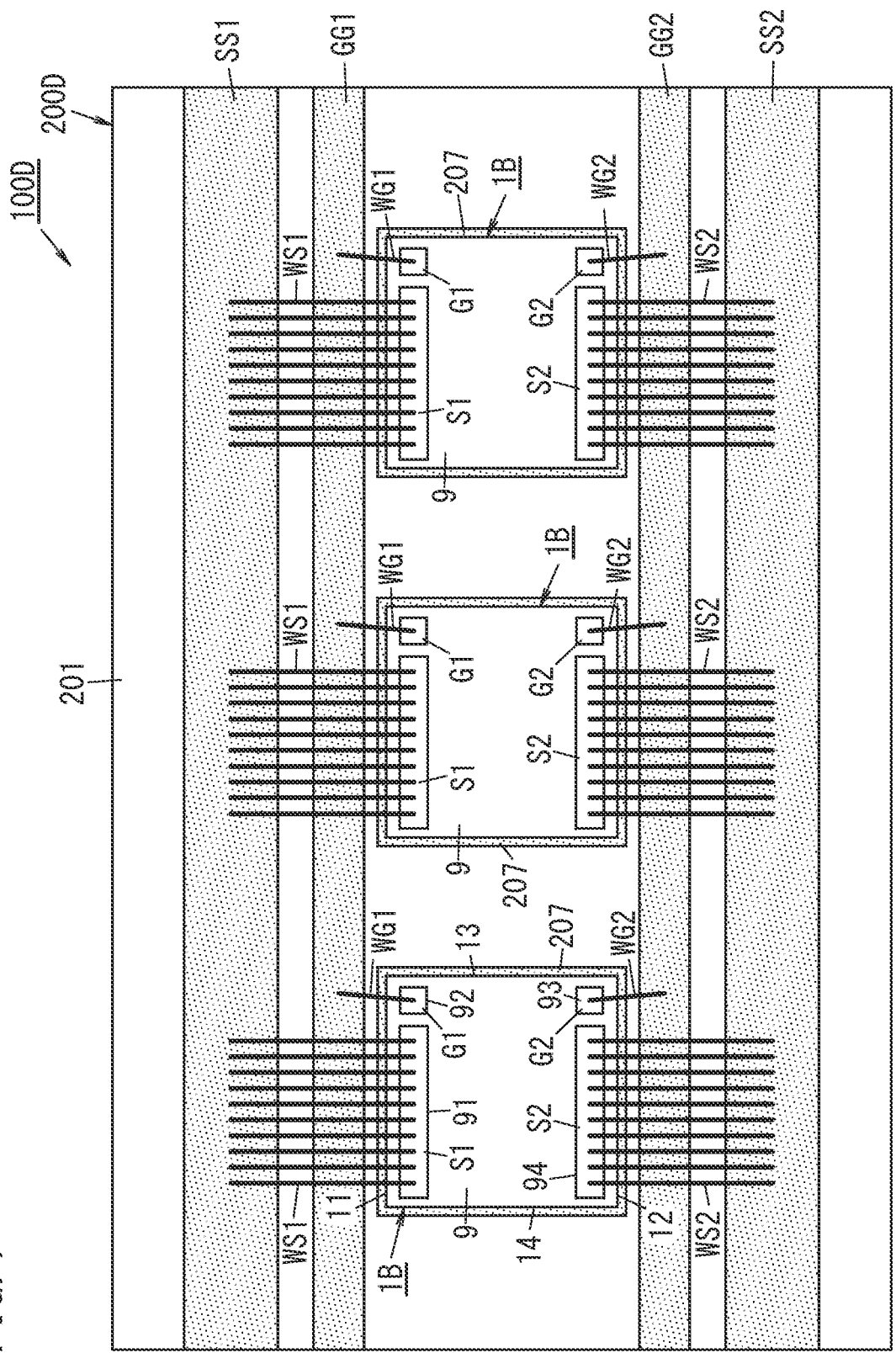
FIG. 7 is a plan view of a bidirectional switch module according to a second embodiment.

Next, a bidirectional switch module 100D according to a second embodiment will be described with reference to FIGS. 7 and 8.

The bidirectional switch module 100D according to the second embodiment includes a plurality of bidirectional switches 1B instead of the plurality of bidirectional switches 1 of the bidirectional switch module 100 according to the first embodiment, which is a major difference from the bidirectional switch module 100. In addition, the bidirectional switch module 100D according to the second embodiment includes a mount board 200D instead of the mount board 200 of the bidirectional switch module 100 according to the first embodiment, which is another major difference from the bidirectional switch module 100. In the following description, any constituent element of the bidirectional switch module 100D according to this second embodiment, having the same function as a counterpart of the bidirectional switch module 100 according to the first embodiment described above, will be designated by the same reference numeral as that counterpart's, and description thereof will be omitted as appropriate herein.

The mount board 200D includes neither the first gate line extensions GG11 nor the second gate line extensions GG21 of the mount board 200 shown in FIG. 1.

The bidirectional switch 1B is different from the bidirectional switch 1 in the layout of the first gate electrode pad G1, the second gate electrode pad G2, the first source electrode pad S1, and the second source electrode pad S2.

Figure 8:
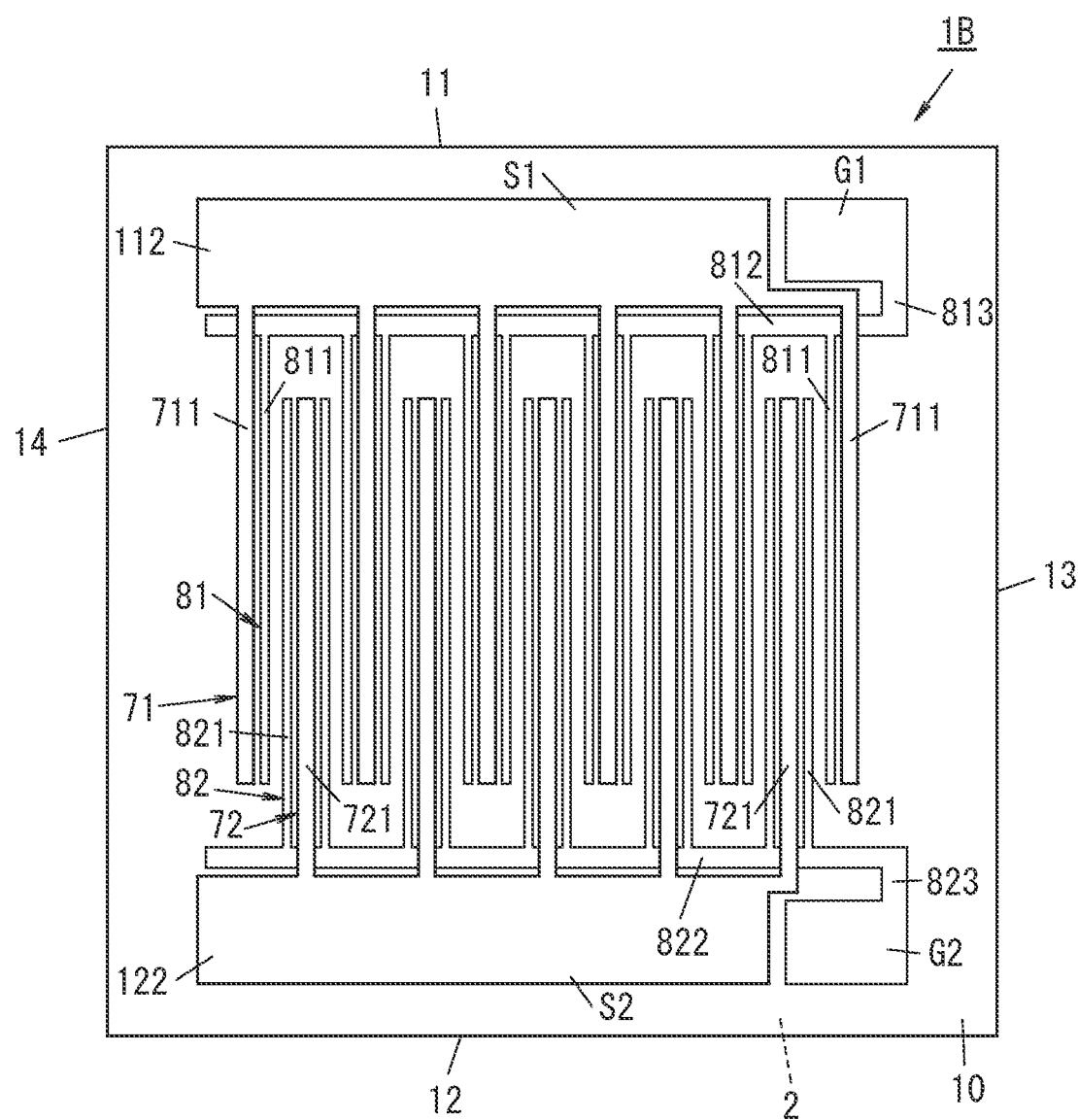
FIG. 8 illustrates a layout in a plan view for each bidirectional switch included in the bidirectional switch module.

In the bidirectional switch 1B, the first source electrode pad S1 and the first gate electrode pad G1 are arranged along the first side 11 as shown in FIG. 8. The first source electrode pad S1 and the first gate electrode pad G1 are arranged in line. In the direction aligned with the first side 11, the first source electrode pad S1 is longer than the first gate electrode pad G1.

The second source electrode pad S2 and the second gate electrode pad G2 are arranged along the second side 12. The second source electrode pad S2 and the second gate electrode pad G2 are arranged in line. In the direction aligned with the second side 12, the second source electrode pad S2 is longer than the second gate electrode pad G2.

In the bidirectional switch module 100D according to the second embodiment, each of the plurality of bidirectional switches 1B is mounted on an associated one of the plurality of die pad portions 207 of the mount board 200D. In the bidirectional switch module 100D, the first gate electrode pad G1 of each of the plurality of bidirectional switches 1B and the first gate line portion GG1 of the mount board 200D are electrically connected together via a first gate wire WG1.

In addition, in the bidirectional switch module 100D, the second gate electrode pad G2 of each of the plurality of bidirectional switches 1B and the second gate line portion GG2 of the mount board 200D are electrically connected together via a second gate wire WG2.

Furthermore, in the bidirectional switch module 100D, the first source electrode pad S1 of each of the plurality of bidirectional switches 1B and the first source line portion SS1 of the mount board 200D are electrically connected together via a plurality of first source wires WS1.

Furthermore, in the bidirectional switch module 100D, the second source electrode pad S2 of each of the plurality of bidirectional switches 1B and the second source line portion SS2 of the mount board 200D are electrically connected together via a plurality of second source wires WS2. In this embodiment, on the mount board 200D, the first source line portion SS1, the first gate line portion GG1, the second gate line portion GG2, and the second source line portion SS2 are arranged side by side in this order. However, this is only an example and should not be construed as limiting. Alternatively, the first gate line portion GG1, the first source line portion SS1, the second source line portion SS2, and the second gate line portion GG2 may be arranged in this order.

In the bidirectional switch module 100D according to the second embodiment, the plurality of bidirectional switches 1B are connected in parallel, thus contributing to enabling a larger amount of current to flow through itself as in the bidirectional switch module 100 according to the first embodiment.

Third Embodiment

Next, a bidirectional switch module 100E according to a third embodiment will be described with reference to FIGS. 9, 10A, and 10B.

The bidirectional switch module 100E according to the third embodiment includes a plurality of bidirectional switches 1D, 1C, 1D instead of the plurality of bidirectional switches 1A, 1, 1A of the bidirectional switch module 100B (see FIG. 5) according to the second variation of the first embodiment, which is a major difference from the bidirectional switch module 100B according to the second variation of the first embodiment. In the following description, any constituent element of the bidirectional switch module 100E according to this third embodiment, having the same function as a counterpart of the bidirectional switch module 100B according to the second variation of the first embodiment described above, will be designated by the same reference numeral as that counterpart's, and description thereof will be omitted as appropriate herein.

Figure 10A:
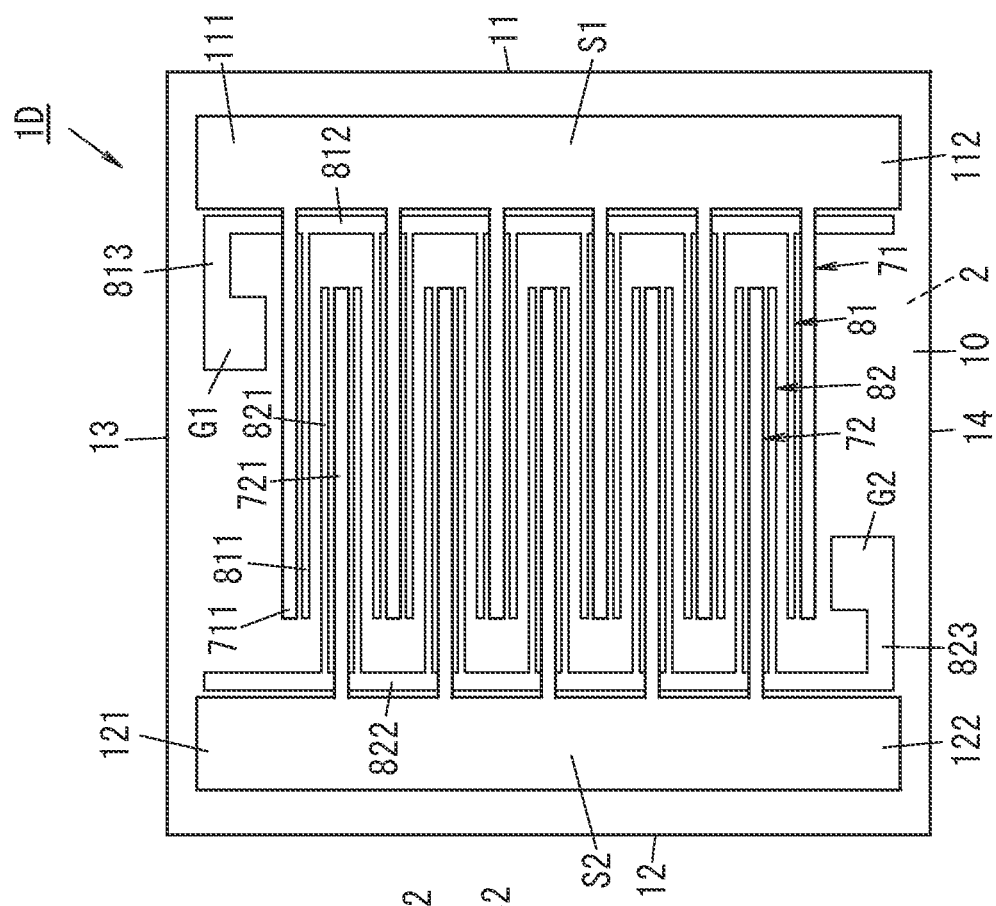
FIG. 10A illustrates a layout in a plan view for one of two types of bidirectional switches included in the bidirectional switch module.

In the bidirectional switch 1C, the first source electrode pad S1 is arranged along the first side 11 as shown in FIG. 10A. The second source electrode pad S2 is arranged along the second side 12. The first gate electrode pad G1 is arranged along the third side 13. The second gate electrode pad G2 is arranged along the fourth side 14.

In the bidirectional switch 1C, the distance between the first gate electrode pad G1 and the first source electrode pad S1 is shorter than the distance between the first gate electrode pad G1 and the second source electrode pad S2, and the distance between the second gate electrode pad G2 and the second source electrode pad S2 is shorter than the distance between the second gate electrode pad G2 and the first source electrode pad S1.

Figure 10B:
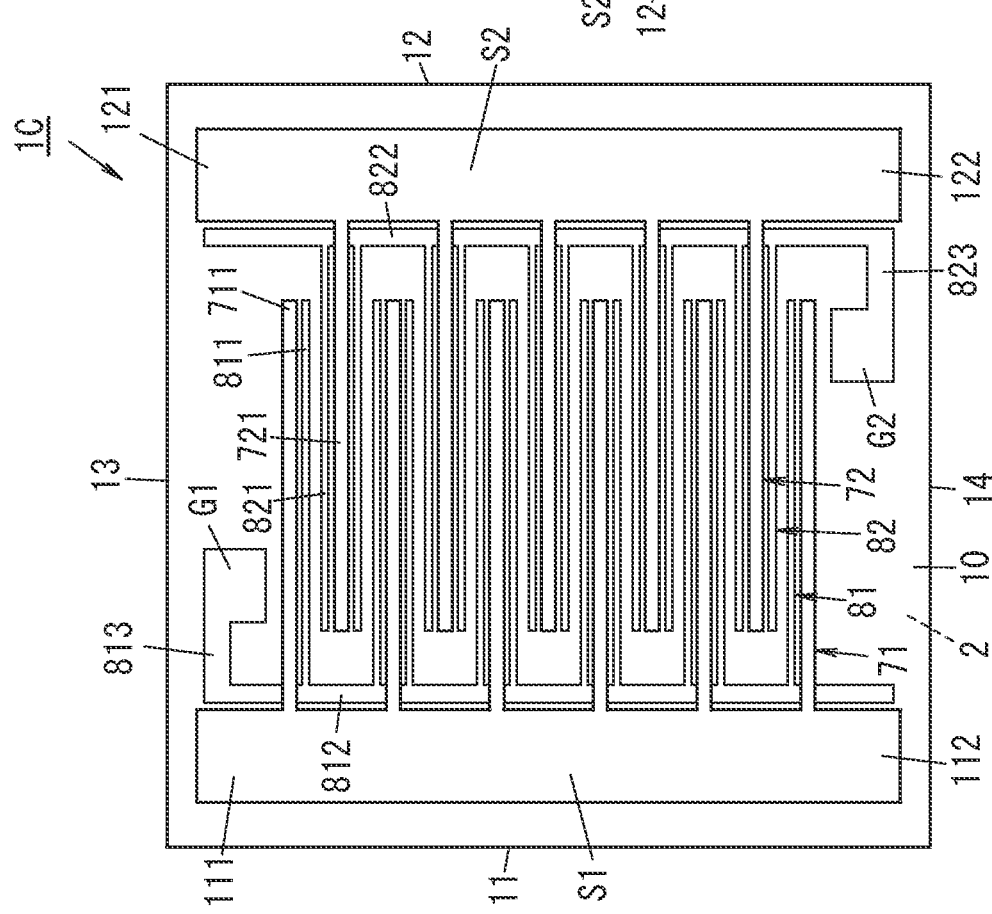
FIG. 10B illustrates a layout in a plan view for the other of the two types of bidirectional switches included in the bidirectional switch module.

In the bidirectional switch 1D, if the first side 11 and the second side 12 are interchanged with each other with respect to the bidirectional switch 1C, the first source electrode pad S1 is arranged along the first side 11 as shown in FIG. 10B. The second source electrode pad S2 is arranged along the second side 12. The first gate electrode pad G1 is arranged along the third side 13. The second gate electrode pad G2 is arranged along the fourth side 14.

Also, in the bidirectional switch 1D, the distance between the first gate electrode pad G1 and the first source electrode pad S1 is shorter than the distance between the first gate electrode pad G1 and the second source electrode pad S2.

In addition, in the bidirectional switch 1D, the distance between the second gate electrode pad G2 and the second source electrode pad S2 is shorter than the distance between the second gate electrode pad G2 and the first source electrode pad S1.

Thus, the bidirectional switch 1C is a mirror image of the bidirectional switch 1D in a plan view.

Figure 9:
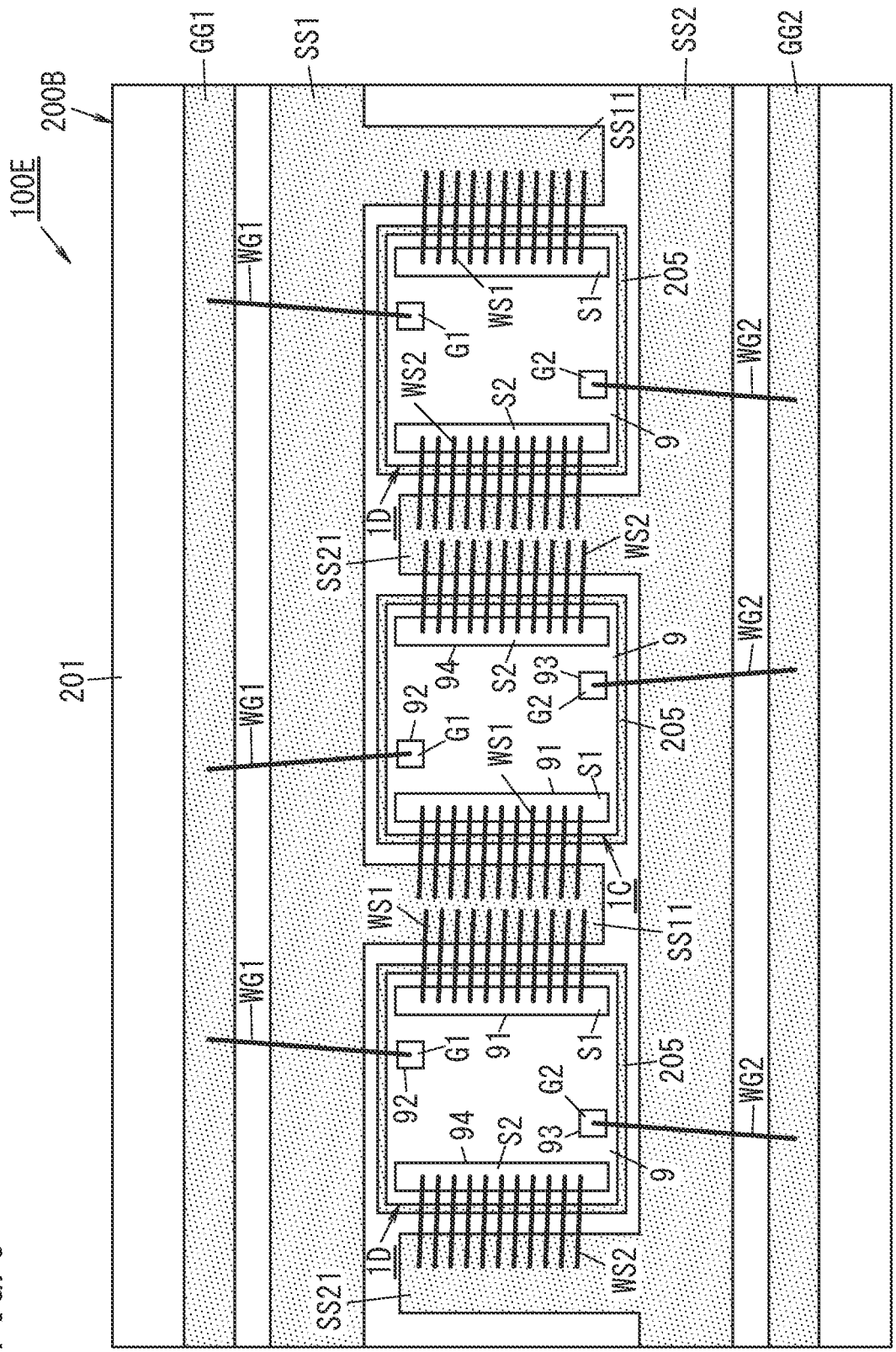
FIG. 9 is a plan view of a bidirectional switch module according to a third embodiment.

In the bidirectional switch module 100E, the three bidirectional switches 1D, 1C, 1D are arranged side by side in the order of the bidirectional switch 1D, the bidirectional switch 1C, and the bidirectional switch 1D from left to right in FIG. 9. In the bidirectional switch module 100E, each of the bidirectional switches 1D, 1C, 1D is mounted on an associated one of the plurality of (three) die pad portions 205 of the mount board 200B.

In the bidirectional switch module 100E, the plurality of bidirectional switches 1D, 1C, 1D are connected in parallel, thus contributing to enabling a larger amount of current to flow through itself as in the bidirectional switch module 100B according to the second variation of the first embodiment.

In addition, the bidirectional switch module 100E includes the plurality of bidirectional switches 1D, 1C, 1D instead of the bidirectional switches 1A, 1, 1A of the bidirectional switch module 100B (see FIG. 5), thus allowing making the respective lengths of the first gate wires WG1 and the second gate wires WG2 approximately equal to each other. Thus, the bidirectional switch module 100E may reduce the difference in parasitic inductance between the first gate wires WG1 and the second gate wires WG2.

Fourth Embodiment

Figure 11:
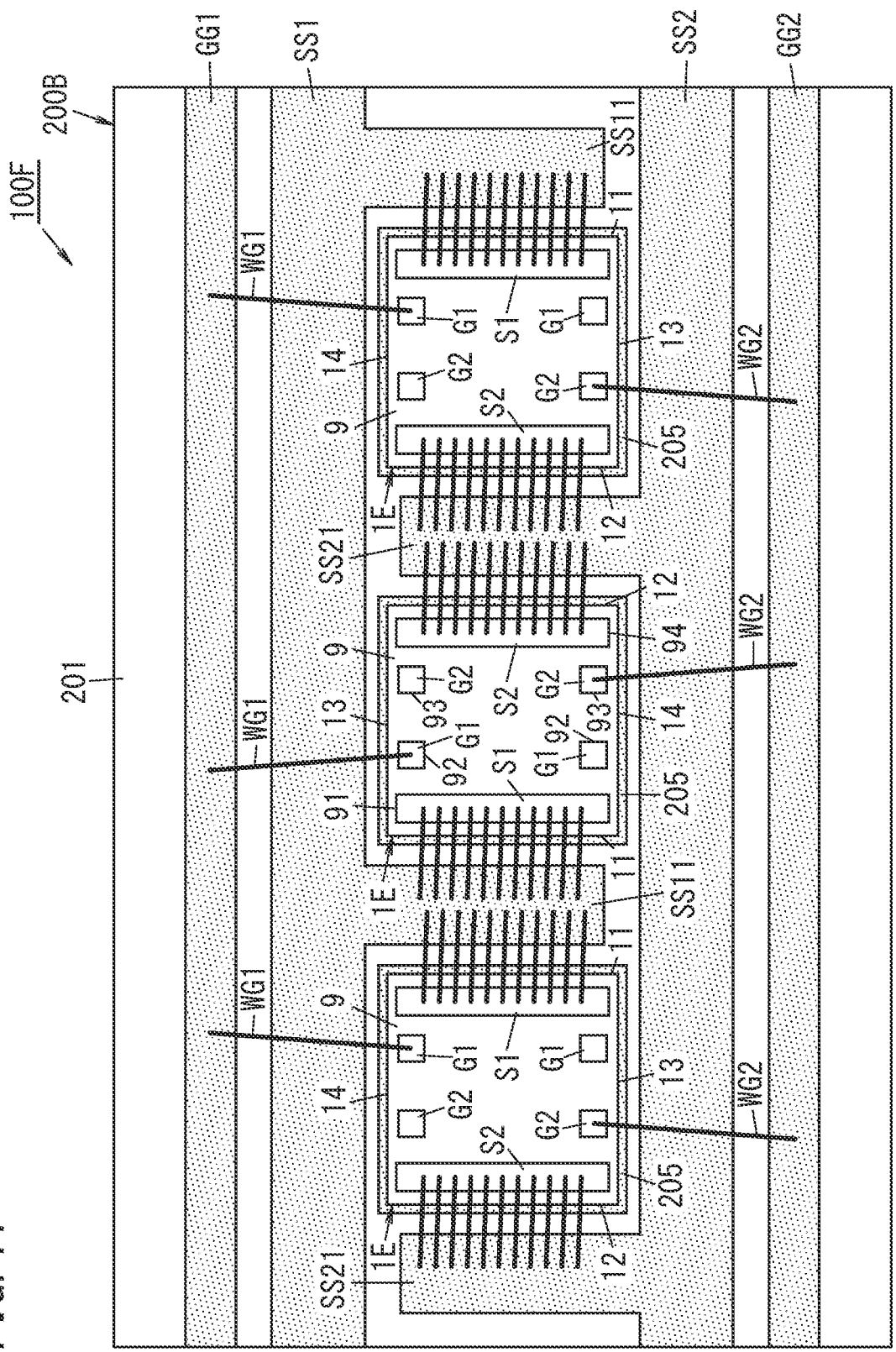
FIG. 11 is a plan view of a bidirectional switch module according to a fourth embodiment.

Next, a bidirectional switch module 100F according to a fourth embodiment will be described with reference to FIGS. 11 and 12.

The bidirectional switch module 100F according to the fourth embodiment includes a plurality of bidirectional switches 1E instead of the plurality of bidirectional switches 1D, 1C, 1D of the bidirectional switch module 100E according to the third embodiment, which is a major difference from the bidirectional switch module 100E according to the third embodiment. In the following description, any constituent element of the bidirectional switch module 100F according to this fourth embodiment, having the same function as a counterpart of the bidirectional switch module 100E according to the third embodiment described above, will be designated by the same reference numeral as that counterpart's, and description thereof will be omitted as appropriate herein.

Figure 12:
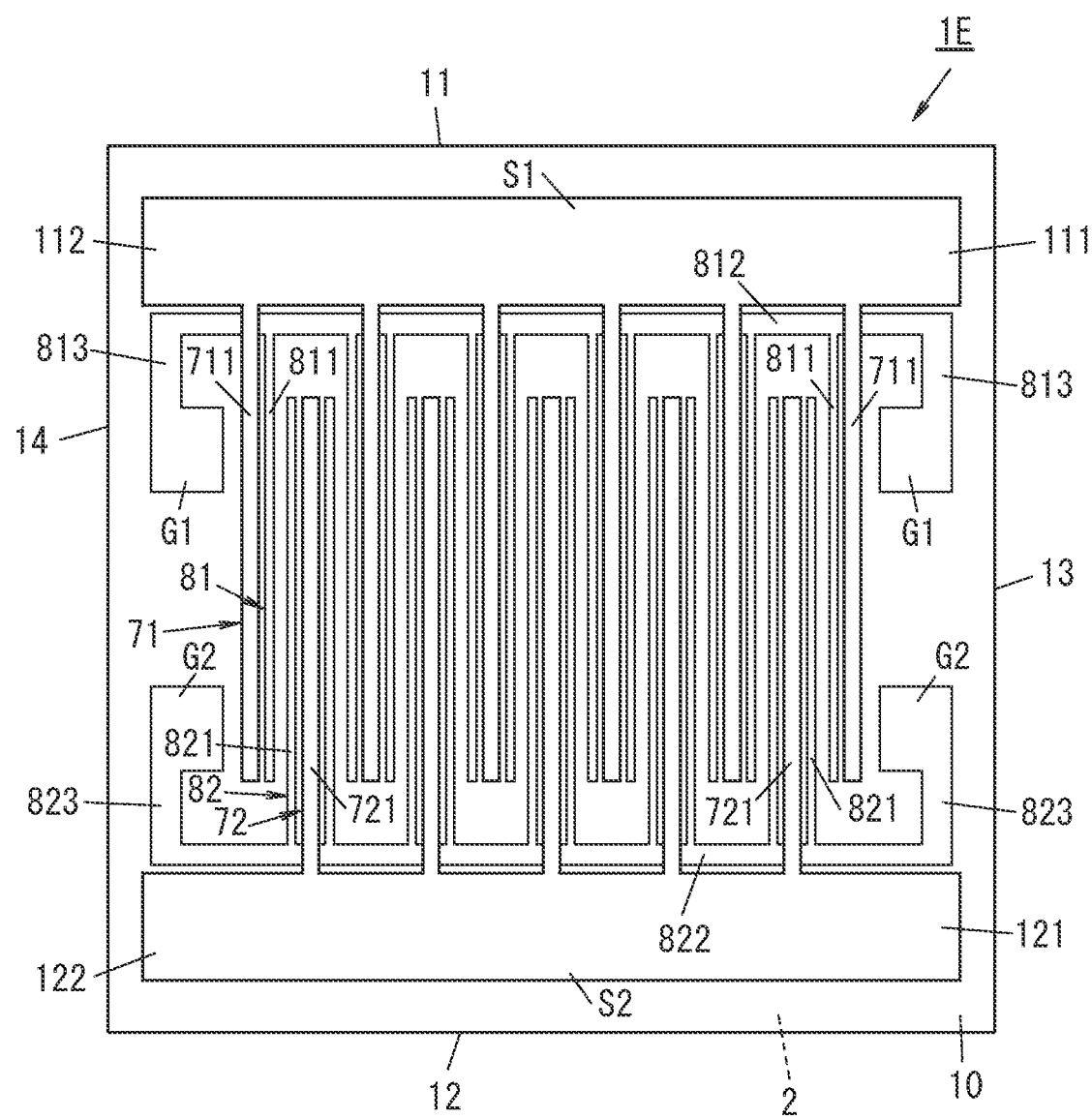
FIG. 12 illustrates a layout in a plan view for each bidirectional switch included in the bidirectional switch module.

The bidirectional switch 1E includes a first source electrode pad S1, two first gate electrode pads G1, two second gate electrode pads G2, and a second source electrode pad S2 as shown in FIG. 12.

The first source electrode pad S1 is electrically connected to the plurality of first source electrode comb teeth 711.

The two first gate electrode pads G1 are electrically connected to the plurality of first gate electrode comb teeth 811.

The two second gate electrode pads G2 are electrically connected to the plurality of second gate electrode comb teeth 821.

The second source electrode pad S2 is electrically connected to the plurality of second source electrode comb teeth 721.

The bidirectional switch 1E has a first side 11 and a second side 12 which are parallel to each other in a plan view and a third side 13 and a fourth side 14 which are parallel to each other in a plan view.

The first source electrode pad S1 is arranged along the first side 11 and the second source electrode pad S2 is arranged along the second side 12.

One of the two first gate electrode pads G1 and one of the two second gate electrode pads G2 are arranged along the third side 13. Between (the first end 111 of) the first source electrode pad S1 and (the first end 121 of) the second source electrode pad S2, the one first gate electrode pad G1 is located closer to the first source electrode pad S1 and the one second gate electrode pad G2 is located closer to the second source electrode pad S2.

The other of the two first gate electrode pads G1 and the other of the two second gate electrode pads G2 are arranged along the fourth side 14. Between (the second end 112 of) the first source electrode pad S1 and (the second end 122 of) the second source electrode pad S2, the other first gate electrode pad G1 is located closer to the first source electrode pad S1 and the other second gate electrode pad G2 is located closer to the second source electrode pad S2.

In the bidirectional switch module 100F according to the fourth embodiment, the plurality of bidirectional switches 1E are arranged such that the first source electrode pad S1 and second source electrode pad S2 of each of the plurality of bidirectional switches 1E are adjacent to a first source line extension SS11 and a second source line extension SS21, respectively associated with the first source electrode pad S1 and the second source electrode pad S2, of the mount board 200B. In this embodiment, each of the plurality of bidirectional switches 1E is mounted on an associated one of the plurality of die pad portions 205 of the mount board 200B. Thus, in the example illustrated in FIG. 11, in the bidirectional switch 1E on the left end and the bidirectional switch 1E on the right end, the fourth side 14 is located closer to the first gate line portion GG1 and the third side 13 is located closer to the second gate line portion GG2. Also, in the example illustrated in FIG. 11, in the middle bidirectional switch 1E, the third side 13 is located closer to the first gate line portion GG1 and the fourth side 14 is located closer to the second gate line portion GG2.

In the bidirectional switch module 100F, the plurality of bidirectional switches 1E are connected in parallel, thus contributing to enabling a larger amount of current to flow through itself as in the bidirectional switch module 100E according to the third embodiment.

In addition, in the bidirectional switch module 100F, each of the plurality of bidirectional switches 1E includes two first gate electrode pads G1 and two second gate electrode pads G2, thus allowing making the respective lengths of the first gate wire WG1 and the second gate wire WG2 approximately equal to each other.

Furthermore, in the bidirectional switch module 100F, chips with the same structure may be used as the plurality of bidirectional switches 1E, thus contributing to cutting down the cost.

Fifth Embodiment

Next, a bidirectional switch module 100G according to a fifth embodiment will be described with reference to FIG. 13.

The bidirectional switch module 100G according to the fifth embodiment includes a bidirectional switch 1G instead of the middle one of the three bidirectional switches 1 that are arranged side by side in line in the bidirectional switch module 100 according to the first embodiment, which is a major difference from the bidirectional switch module 100 according to the first embodiment. In addition, the bidirectional switch module 100G according to the fifth embodiment includes a mount board 200G instead of the mount board 200 of the bidirectional switch module 100 according to the first embodiment, which is another major difference from the bidirectional switch module 100 according to the first embodiment. In the following description, any constituent element of the bidirectional switch module 100G according to this fifth embodiment, having the same function as a counterpart of the bidirectional switch module 100 according to the first embodiment described above, will be designated by the same reference numeral as that counterpart's, and description thereof will be omitted as appropriate herein.

The bidirectional switch 1G has substantially the same configuration as the bidirectional switch 1 and is a mirror image of the bidirectional switch 1 in a plan view.

In the bidirectional switch 1, it is near and along the third side out of the third and fourth sides that the first source electrode pad S1, the first gate electrode pad G1, the second gate electrode pad G2, and the second source electrode pad S2 are arranged side by side. On the other hand, in the bidirectional switch 1G, it is along the fourth side 14 that the first source electrode pad S1, the first gate electrode pad G1, the second gate electrode pad G2, and the second source electrode pad S2 are arranged side by side. Optionally, the bidirectional switch 1G may use the same chip as the bidirectional switch 1 by using the first source electrode pad S1, the first gate electrode pad G1, the second gate electrode pad G2, and the second source electrode pad S2 of the bidirectional switch 1 as the second source electrode pad S2, the second gate electrode pad G2, the first gate electrode pad G1, and the first source electrode pad S1, respectively.

In addition, in the bidirectional switch module 100G, the first gate electrode pad G1 of the left one 1 of the three bidirectional switches 1, 1G, 1 and the first gate electrode pad G1 of the middle one 1G of the three bidirectional switches 1, 1G, 1 are connected to the same first gate line extension GG11. Also, in the bidirectional switch module 100G, the second gate electrode pad G2 of the left one 1 of the three bidirectional switches 1, 1G, 1 and the second gate electrode pad G2 of the middle one 1G of the three bidirectional switches 1, 1G, 1 are connected to the same second gate line extension GG21.

Furthermore, in the bidirectional switch module 100G, no first gate line extensions GG11 or second gate line extensions GG21 are arranged between the middle bidirectional switch 1G and the right bidirectional switch 1 out of the three bidirectional switches 1, 1G, 1. Thus, the bidirectional switch module 100G according to the fifth embodiment may increase the mount density compared to the bidirectional switch module 100 according to the first embodiment.

Furthermore, in the bidirectional switch module 100G according to the fifth embodiment, the plurality of bidirectional switches 1, 1G, 1 are connected in parallel, thus contributing to enabling a larger amount of current to flow through itself as in the bidirectional switch module 100 according to the first embodiment.

(Variations)

Note that the embodiments described above are only exemplary ones of various embodiments of the present disclosure and should not be construed as limiting. Rather, the exemplary embodiments may be readily modified in various manners depending on a design choice or any other factor without departing from the scope of the present disclosure.

For example, the number of the bidirectional switches 1 in the bidirectional switch module 100 according to the first embodiment does not have to be three but may also be two or even four or more. The same statement applies to the first to third variations of the first embodiment and the second to fifth embodiments.

Furthermore, in the bidirectional switch module 100 according to the first embodiment, the plurality of bidirectional switches 1 does not have to be arranged to form a single line but may also be arranged to form a plurality of lines (e.g., two lines) or to form an L pattern. The arrangement pattern of the first source line portion SS1, the first gate line portion GG1, the second gate line portion GG2, and the second source line portion SS2 may be changed as appropriate according to the arrangement of the plurality of bidirectional switches 1. In that case, the number of the first source line portion SS1, first gate line portion GG1, second gate line portion GG2, or second source line portion SS2 provided has to be one but may also be two or more. In the same way, as for the first to third variations of the first embodiment and the second to fifth embodiments, a plurality of bidirectional switches may also be arranged to form multiple lines.

Optionally, each of the plurality of bidirectional switches 1 of the bidirectional switch module 100 according to the first embodiment may be replaced with either the bidirectional switch 1A of the bidirectional switch module 100B according to the second variation of the first embodiment or the bidirectional switch 1B of the bidirectional switch module 100D according to the second embodiment, whichever is appropriate.

Furthermore, the conductor portion 203 of the bidirectional switch module 100A according to the first variation of the first embodiment is also applicable to any of the second and third variations of the first embodiment and the second to fourth embodiments.

Furthermore, each of the bidirectional switches 1-1G may include one or more nitride semiconductor layers between the buffer layer 3 and the first nitride semiconductor layer 4. Furthermore, the buffer layer 3 does not have to have a single layer structure but may also have a superlattice structure, for example.

Furthermore, each of the bidirectional switches 1-1G includes the first p-type layer 61 and the second p-type layer 62. However, this is only an example and should not be construed as limiting. Alternatively, the bidirectional switches 1-1G may include neither the first p-type layer 61 nor the second p-type layer 62.

Furthermore, the substrate 2 does not have to be a silicon substrate but may also be a GaN substrate, an SiC substrate, or any other suitable substrate.

Furthermore, the bidirectional switch 1 does not have to be lateral transistor but may also be vertical transistor.

Furthermore, the first gate electrode pad G1 and the second gate electrode pad G2 do not have to have a square shape in a plan view but may also have a circular, rectangular, or any other appropriate planar shape.

Furthermore, in the embodiments and their variations described above, the bidirectional switches 1-1E, 1G each have a square shape in a plan view. However, this is only an example and should not be construed as limiting. Alternatively, the bidirectional switches 1-1E, 1G may each have a rectangular shape in a plan view. If the bidirectional switch 1-1E, 1G has a rectangular planar shape, then the length of the third and fourth sides 13, 14 is suitably shortened compared to each side of the square bidirectional switch 1-1E, 1G and the length of the first and second sides 11, 12 is suitably extended compared to each side of the square bidirectional switch 1-1E, 1G. In this case, shortening the length of each of the first source electrode comb teeth 711, the first gate electrode comb teeth 811, the second gate electrode comb teeth 821, and the second source electrode comb teeth 721 allows the ON-state resistance to be lowered. In addition, increasing the number of the first source electrode comb teeth 711, the first gate electrode comb teeth 811, the second gate electrode comb teeth 821, and the second source electrode comb teeth 721 enables a larger amount of current to flow through the bidirectional switch 1-1E, 1G.

Furthermore, each of the mount boards 200-200D, 200G may also be a multi-layer board (such as a multi-layer ceramic board). Also, in each of the mount boards 200-200D, 200G, each of the first source line portion SS1, the first gate line portion GG1, the second gate line portion GG2, and the second source line portion SS2 may have a single layer structure or a multi-layer structure, whichever is appropriate.

Furthermore, the first source electrode pad S1, the first gate electrode pad G1, the second gate electrode pad G2, and the second source electrode pad S2 of the bidirectional switch 1 and the first source line portion SS1, the first gate line portion GG1, the second gate line portion GG2, and the second source line portion SS2 of the mount board 200 do not have to be connected via the first source wires WS1, the first gate wire WG1, the second gate wire WG2, and the second source wires WS2 but may also be connected via a ribbon-shaped conductive member or by flip-chip bonding technique as well.

The bidirectional switch module 100-100G is applicable to, for example, various types of electrical devices such as multi-level inverters, dimmers, and matrix converters for performing AC-AC power conversion.

(Aspects)

The embodiments and their variations described above may be specific implementations of the following aspects of the present disclosure.

A bidirectional switch module (100; 100A; 100B; 100C; 100D; 100E; 100F; 100G) according to a first aspect includes a plurality of bidirectional switches (1; 1A; 1B; 1C; 1D; 1E; 1G) and a mount board (200; 200A; 200C; 200D; 200G). Each of the plurality of bidirectional switches (1; 1A; 1B; 1C; 1D; 1E; 1G) includes a first source electrode (71), a first gate electrode (81), a second gate electrode (82), and a second source electrode (72). On the mount board (200; 200A; 200C; 200D; 200G), the plurality of bidirectional switches (1; 1A; 1B; 1C; 1D; 1E; 1G) are mounted. In the bidirectional switch module (100; 100A; 100B; 100C; 100D; 100E; 100F; 100G), the plurality of bidirectional switches (1; 1A; 1B; 1C; 1D; 1E; 1G) are connected in parallel.

The bidirectional switch module (100; 100A; 100B; 100C; 100D; 100E; 100F; 100G) according to the first aspect may contribute to enabling a large amount of current to flow through itself.

In a bidirectional switch module (100; 100A; 100B; 100C; 100D; 100E; 100F; 100G) according to a second aspect, which may be implemented in conjunction with the first aspect, each of the plurality of bidirectional switches (1; 1A; 1B; 1C; 1D; 1E; 1G) is a lateral transistor.

The bidirectional switch module (100; 100A; 100B; 100C; 100D; 100E; 100F; 100G) according to the second aspect may contribute to increasing the switching rate compared to a situation where each of the plurality of bidirectional switches (1; 1A; 1B; 1C; 1D; 1E; 1G) is a vertical transistor.

In a bidirectional switch module (100; 100A; 100B; 100C; 100D; 100E; 100F; 100G) according to a third aspect, which may be implemented in conjunction with the second aspect, each of the plurality of bidirectional switches (1; 1A; 1B; 1C; 1D; 1E; 1G) includes a substrate (2), a first nitride semiconductor layer (4), and a second nitride semiconductor layer (5). The nitride semiconductor layer (4) is formed over the substrate (2). The second nitride semiconductor layer (5) is formed on the first nitride semiconductor layer (4). The second nitride semiconductor layer (5) has a larger bandgap than the first nitride semiconductor layer (4). In each of the plurality of bidirectional switches (1; 1A; 1B; 1C; 1D; 1E; 1G), the first source electrode (71), the first gate electrode (81), the second gate electrode (82), and the second source electrode (72) are formed on or over the second nitride semiconductor layer (5).

The bidirectional switch module (100; 100A; 100B; 100C; 100D; 100E; 100F; 100G) according to the third aspect may contribute to lowering the resistance.

In a bidirectional switch module (100; 100A; 100B; 100C 100D; 100E; 100F; 100G) according to a fourth aspect, which may be implemented in conjunction with the third aspect, each of the plurality of bidirectional switches (1; 1A; 1B; 1C; 1D; 1E; 1G) further includes a first p-type layer (61) and a second p-type layer (62). The first p-type layer (61) is interposed between the first gate electrode (81) and the second nitride semiconductor layer (5). The second p-type layer (62) is interposed between the second gate electrode (82) and the second nitride semiconductor layer (5).

In the bidirectional switch module (100; 100A; 100B; 100C; 100D; 100E; 100F; 100G) according to the fourth aspect, each of the plurality of bidirectional switches (1; 1A; 1B; 1C; 1D; 1E; 1G) may be implemented as a normally OFF transistor.

A bidirectional switch module (100; 100A; 100B; 100C; 100D; 100E; 100F; 100G) according to a fifth aspect may be implemented in conjunction with the fourth aspect. In each of the plurality of bidirectional switches (1; 1A; 1B; 1C; 1D; 1E; 1G), the substrate (2) has electrical conductivity. The substrate (2) is electrically insulated from all of the first source electrode (71), the second source electrode (72), the first gate electrode (81), and the second gate electrode (82). The mount board (200; 200A; 200C; 200D; 200G) includes a conductor portion (203) to which the respective substrates (2) of the plurality of bidirectional switches (1; 1A; 1B; 1C; 1D; 1E; 1G) are electrically connected. The conductor portion (203) includes a plurality of die pad portions (204). The plurality of die pad portions (204) are associated one to one with the plurality of bidirectional switches (1; 1A; 1B; 1C; 1D; 1E; 1G). Each of the plurality of die pad portions (204) mounts an associated one of the plurality of bidirectional switches (1; 1A; 1B; 1C; 1D; 1E; 1G).

The bidirectional switch module (100; 100A; 100B; 100C; 100D; 100E; 100F; 100G) according to the fifth aspect allows the respective substrates (2) of the plurality of bidirectional switches (1; 1A; 1B; 1C; 1D; 1E; 1G) to be connected to a constant potential node via the conductor portion (203), thus enabling reducing a current collapse.

A bidirectional switch module (100; 100A) according to a sixth aspect may be implemented in conjunction with any one of the first to fifth aspects. In each of the plurality of bidirectional switches (1; 1A), the first source electrode (71) includes a plurality of first source electrode comb teeth (711). The first gate electrode (81) includes a plurality of first gate electrode comb teeth (811). The second gate electrode (82) includes a plurality of second gate electrode comb teeth (821). The second source electrode (72) includes a plurality of second source electrode comb teeth (721). The plurality of first source electrode comb teeth (711) and the plurality of second source electrode comb teeth (721) are alternately arranged one by one. Between each pair of a first source electrode comb tooth (711) and a second source electrode comb tooth (721) which are adjacent to each other, one first gate electrode comb tooth (811), out of the plurality of first gate electrode comb teeth (811), and one second gate electrode comb tooth (821), out of the plurality of second gate electrode comb teeth (821), are arranged side by side in this order from the first source electrode comb tooth (711) toward the second source electrode comb tooth (721). Each of the plurality of bidirectional switches (1; 1A) further includes a first source electrode pad (S1), a first gate electrode pad (G1), a second gate electrode pad (G2), and a second source electrode pad (S2). The first source electrode pad (S1) is electrically connected to the plurality of first source electrode comb teeth (711). The first gate electrode pad (G1) is electrically connected to the plurality of first gate electrode comb teeth (811). The second gate electrode pad (G2) is electrically connected to the plurality of second gate electrode comb teeth (821). The second source electrode pad (S2) is electrically connected to the plurality of second source electrode comb teeth (721). Each of the plurality of bidirectional switches (1; 1A) has a first side (11) and a second side (12) which are parallel to each other in a plan view, and a third side (13) and a fourth side (14) which are parallel to each other in a plan view. The first source electrode pad (S1) is arranged along the first side (11). The second source electrode pad (S2) is arranged along the second side (12). The first gate electrode pad (G1) and the second gate electrode pad (G2) are arranged along the third side (13). In a direction aligned with the third side (13), the first source electrode pad (S1), the first gate electrode pad (G1), the second gate electrode pad (G2), and the second source electrode pad (S2) are arranged side by side in this order.

The bidirectional switch module (100; 100A) according to the sixth aspect may increase the number of the first source electrode comb teeth (711), the first gate electrode comb teeth (811), the second gate electrode comb teeth (821), and the second source electrode comb teeth (721), thus contributing to enabling a large amount of current to flow through itself.

A bidirectional switch module (100D) according to a seventh aspect may be implemented in conjunction with any one of the first to fifth aspects. In each of the plurality of bidirectional switches (1B), the first source electrode (71) includes a plurality of first source electrode comb teeth (711). The first gate electrode (81) includes a plurality of first gate electrode comb teeth (811). The second gate electrode (82) includes a plurality of second gate electrode comb teeth (821). The second source electrode (72) includes a plurality of second source electrode comb teeth (721). The plurality of first source electrode comb teeth (711) and the plurality of second source electrode comb teeth (721) are alternately arranged one by one. Between each pair of a first source electrode comb tooth (711) and a second source electrode comb tooth (721) which are adjacent to each other, one first gate electrode comb tooth (811), out of the plurality of first gate electrode comb teeth (811), and one second gate electrode comb tooth (821), out of the plurality of second gate electrode comb teeth (821), are arranged side by side in this order from the first source electrode comb tooth (711) toward the second source electrode comb tooth (721). Each of the plurality of bidirectional switches (1B) includes a first source electrode pad (S1), a first gate electrode pad (G1), a second gate electrode pad (G2), and a second source electrode pad (S2). The first source electrode pad (S1) is electrically connected to the plurality of first source electrode comb teeth (711). The first gate electrode pad (G1) is electrically connected to the plurality of first gate electrode comb teeth (811). The second gate electrode pad (G2) is electrically connected to the plurality of second gate electrode comb teeth (821). The second source electrode pad (S2) is electrically connected to the plurality of second source electrode comb teeth (721). Each of the plurality of bidirectional switches (1B) has a first side (11) and a second side (12) which are parallel to each other in a plan view, and a third side (13) and a fourth side (14) which are parallel to each other in a plan view. The first source electrode pad (S1) and the first gate electrode pad (G1) are arranged along the first side (11). In a direction aligned with the first side (11), the first source electrode pad (S1) is longer than the first gate electrode pad (G1). The second source electrode pad (S2) and the second gate electrode pad (G2) are arranged along the second side (12). In a direction aligned with the second side (12), the second source electrode pad (S2) is longer than the second gate electrode pad (G2).

In the bidirectional switch module (100D) according to the seventh aspect, line portions on the mount board (200D) (namely, a first gate line portion GG1 and a second gate line portion GG2) are used to connect a plurality of bidirectional switches (1B) in parallel, thus enabling reducing the parasitic inductance with respect to a first gate signal to be supplied to the first gate electrode pad (G1) and a second gate signal to be supplied to the second gate electrode pad (G2).

A bidirectional switch module (100E) according to an eighth aspect may be implemented in conjunction with any one of the first to fifth aspects. In each of the plurality of bidirectional switches (1C; 1D), the first source electrode (71) includes a plurality of first source electrode comb teeth (711). The first gate electrode (81) includes a plurality of first gate electrode comb teeth (811). The second gate electrode (82) includes a plurality of second gate electrode comb teeth (821). The second source electrode (72) includes a plurality of second source electrode comb teeth (721). The plurality of first source electrode comb teeth (711) and the plurality of second source electrode comb teeth (721) are alternately arranged one by one. Between each pair of a first source electrode comb tooth (711) and a second source electrode comb tooth (721) which are adjacent to each other, one first gate electrode comb tooth (811), out of the plurality of first gate electrode comb teeth (811), and one second gate electrode comb tooth (821), out of the plurality of second gate electrode comb teeth (821), are arranged side by side in this order from the first source electrode comb tooth (711) toward the second source electrode comb tooth (721). Each of the plurality of bidirectional switches (1C; 1D) includes a first source electrode pad (S1), a first gate electrode pad (G1), a second gate electrode pad (G2), and a second source electrode pad (S2). The first source electrode pad (S1) is electrically connected to the plurality of first source electrode comb teeth (711). The first gate electrode pad (G1) is electrically connected to the plurality of first gate electrode comb teeth (811). The second gate electrode pad (G2) is electrically connected to the plurality of second gate electrode comb teeth (821). The second source electrode pad (S2) is electrically connected to the plurality of second source electrode comb teeth (721). Each of the plurality of bidirectional switches (1C; 1D) has a first side (11) and a second side (12) which are parallel to each other in a plan view, and a third side (13) and a fourth side (14) which are parallel to each other in a plan view. The first source electrode pad (S1) is arranged along the first side (11). The second source electrode pad (S2) is arranged along the second side (12). The first gate electrode pad (G1) is arranged along the third side (13). The second gate electrode pad (G2) is arranged along the fourth side (14). A distance between the first gate electrode pad (G1) and the first source electrode pad (S1) is shorter than a distance between the first gate electrode pad (G1) and the second source electrode pad (S2). A distance between the second gate electrode pad (G2) and the second source electrode pad (S2) is shorter than a distance between the second gate electrode pad (G2) and the first source electrode pad (S1).

In the bidirectional switch module (100E) according to the eighth aspect, line portions on the mount board (200B) (namely, a first gate line portion GG1 and a second gate line portion GG2) are used to connect a plurality of bidirectional switches (1C; 1D) in parallel, thus allowing a first gate wire (WG1) and a second gate wire (WG2) formed to have approximately equal lengths and have their length reduced.

A bidirectional switch module (100F) according to a ninth aspect may be implemented in conjunction with any one of the first to fifth aspects. In each of the plurality of bidirectional switches (1E), the first source electrode (71) includes a plurality of first source electrode comb teeth (711). The first gate electrode (81) includes a plurality of first gate electrode comb teeth (811). The second gate electrode (82) includes a plurality of second gate electrode comb teeth (821). The second source electrode (72) includes a plurality of second source electrode comb teeth (721). The plurality of first source electrode comb teeth (711) and the plurality of second source electrode comb teeth (721) are alternately arranged one by one. Between each pair of a first source electrode comb tooth (711) and a second source electrode comb tooth (721) which are adjacent to each other, one first gate electrode comb tooth (811), out of the plurality of first gate electrode comb teeth (811), and one second gate electrode comb tooth (821), out of the plurality of second gate electrode comb teeth (821), are arranged side by side in this order from the first source electrode comb tooth (711) toward the second source electrode comb tooth (721). Each of the plurality of bidirectional switches (1E) includes a first source electrode pad (S1), two first gate electrode pads (G1), two second gate electrode pads (G2), and a second source electrode pad (S2). The first source electrode pad (S1) is electrically connected to the plurality of first source electrode comb teeth (711). The two first gate electrode pads are electrically connected to the plurality of first gate electrode comb teeth (811). The two second gate electrode pads (G2) are electrically connected to the plurality of second gate electrode comb teeth (821). The second source electrode pad (S2) is electrically connected to the plurality of second source electrode comb teeth (721). Each of the plurality of bidirectional switches (1E) has a first side (11) and a second side (12) which are parallel to each other in a plan view, and a third side (13) and a fourth side (14) which are parallel to each other in a plan view. The first source electrode pad (S1) is arranged along the first side (11). The second source electrode pad (S2) is arranged along the second side (12). One first gate electrode pad (G1), out of the two first gate electrode pads (G1), and one second gate electrode pad (G2), out of the two second gate electrode pads (G2), are arranged along the third side (13). Between the first source electrode pad (S1) and the second source electrode pad (S2), the one first gate electrode pad (G1) is located closer to the first source electrode pad (S1) than to the second source electrode pad (S2), and the one second gate electrode pad (G2) is located closer to the second source electrode pad (S2) than to the first source electrode pad (S1). The other first gate electrode pad (G1), out of the two first gate electrode pads (G1), and the other second gate electrode pad (G2), out of the two second gate electrode pads (G2), are arranged along the fourth side (14). Between the first source electrode pad (S1) and the second source electrode pad (S2), the other first gate electrode pad (G1) is located closer to the first source electrode pad (S1) than to the second source electrode pad (S2), and the other second gate electrode pad (G2) is located closer to the second source electrode pad (S2) than to the first source electrode pad (S1).

The bidirectional switch module (100F) according to the ninth aspect allows chips having the same structure to be used as the plurality of bidirectional switches (1E).

In a bidirectional switch module (100; 100A; 100B; 100C; 100D; 100E; 100F; 100G) according to a tenth aspect, which may be implemented in conjunction with any one of the sixth to ninth aspects, each of the plurality of bidirectional switches (1; 1A; 1B; 1C; 1D; 1E; 1G) has a rectangular shape in a plan view.

The bidirectional switch module (100; 100A; 100B; 100C; 100D; 100E; 100F; 100G) according to the tenth aspect enables a larger amount of current to flow through itself while reducing the ON-state resistance of each of the plurality of bidirectional switches (1; 1A; 1B; 1C; 1D; 1E; 1G).

In a bidirectional switch module (100; 100A; 100B; 100C; 100D; 100E; 100F; 100G) according to an eleventh aspect, which may be implemented in conjunction with any one of the sixth to tenth aspects, the mount board (200; 200A; 200C; 200D; 200G) includes an insulating substrate (201); and a first source line portion (SS1), a first gate line portion (GG1), a second gate line portion (GG2), and a second source line portion (SS2). The first source line portion (SS1), the first gate line portion (GG1), the second gate line portion (GG2), and the second source line portion (SS2) are arranged on the insulating substrate (201). The bidirectional switch module (100; 100A; 100B; 100C; 100D; 100E; 100F; 100G) further includes, for each of the plurality of bidirectional switches (1; 1A; 1B; 1C; 1D; 1E; 1G), a first source wire (WS1), a first gate wire (WG1), a second gate wire (WG2), and a second source wire (WS2). The first source wire (WS1) electrically connects the first source electrode (71) of the bidirectional switch (1; 1A; 1B; 1C; 1D; 1E; 1G) to the first source line portion (SS1). The first gate wire (WG1) electrically connects the first gate electrode (81) of the bidirectional switch (1; 1A; 1B; 1C; 1D; 1E; 1G) to the first gate line portion (GG1). The second gate wire (WG2) electrically connects the second gate electrode (82) of the bidirectional switch (1; 1A; 1B; 1C; 1D; 1E; 1G) to the second gate line portion (GG2). The second source wire (WS2) electrically connects the second source electrode (72) of the bidirectional switch (1; 1A; 1B; 1C; 1D; 1E; 1G) to the second source line portion (SS2).

The bidirectional switch module (100; 100A; 100B; 100C; 100D; 100E; 100F; 100G) according to the eleventh aspect allows the plurality of bidirectional switches (1; 1A; 1B; 1C; 1D; 1E; 1G) to be electrically connected in parallel.

A bidirectional switch module (100) according to a twelfth aspect may be implemented in conjunction with the eleventh aspect. On the mount board (200), the first source line portion (SS1), the first gate line portion (GG1), the second gate line portion (GG2), and the second source line portion (SS2) are arranged side by side in this order in a plan view. The plurality of bidirectional switches (1) are provided between, and out of contact with, the first gate line portion (GG1) and the second gate line portion (GG2).

The bidirectional switch module (100) according to the twelfth aspect allows the first gate wires (WG1) and the second gate wires (WG2) to have their length reduced and have approximately the same length.

A bidirectional switch module (100B) according to a thirteenth aspect may be implemented in conjunction with the eleventh aspect. On the mount board (200), the first gate line portion (GG1), the first source line portion (SS1), the second source line portion (SS2), and the second gate line portion (GG2) are arranged side by side in this order in a plan view. The plurality of bidirectional switches (1) are provided between, and out of contact with, the first source line portion (SS1) and the second source line portion (SS2).

The bidirectional switch module (100B) according to the thirteenth aspect allows the first source wires (WS1) and the second source wires (WS2) to have a shorter length.

A bidirectional switch module (100C) according to a fourteenth aspect may be implemented in conjunction with the eleventh aspect. On the mount board (200C), the first gate line portion (GG1), the second gate line portion (GG2), the first source line portion (SS1), and the second source line portion (SS2) are arranged side by side in this order in a plan view. The plurality of bidirectional switches (1) are provided between, and out of contact with, the first source line portion (SS1) and the second source line portion (SS2).

The bidirectional switch module (100C) according to the fourteenth aspect allows the first source wires (WS1) and the second source wires (WS2) to have a shorter length.

In a bidirectional switch module (100; 100A) according to a fifteenth aspect, which may be implemented in conjunction with the twelfth aspect, the mount board (200) further includes a plurality of first gate line extensions (GG11) and a plurality of second gate line extensions (GG21). The first gate line extensions (GG11) extend from the first gate line portion (GG1) toward the second gate line portion (GG2). The plurality of second gate line extensions (GG21) extend from the second gate line portion (GG2) toward the first gate line portion (GG1). The plurality of first gate line extensions (GG11) are associated one to one with the plurality of bidirectional switches (1). Each of the plurality of first gate line extensions (GG11) is adjacent to an associated one of the plurality of bidirectional switches (1). The plurality of second gate line extensions (GG21) are associated one to one with the plurality of bidirectional switches (1). Each of the plurality of second gate line extensions (GG21) is adjacent to an associated one of the plurality of bidirectional switches (1). On the mount board (200), the plurality of first gate line extensions (GG11) and the plurality of second gate line extensions (GG21) correspond one to one, and each of the first gate line extensions (GG11) and a corresponding one of the second gate line extensions (GG21) are arranged such that their respective tips face each other.

In the bidirectional switch module (100; 100A) according to the fifteenth aspect, electrically connecting the first gate electrode pad (G1) of the bidirectional switch (1) to the first gate line extensions (GG11) on the mount board (200) via the first gate wire (WG1) allows the first gate electrode (81) and the first gate line portion (GG1) to be electrically connected together, thus enabling reducing the length of the first gate wire (WG1). In addition, in the bidirectional switch module (100; 100A) according to the fifteenth aspect, electrically connecting the second gate electrode pad (G2) of the bidirectional switch (1) to the second gate line extensions (GG21) on the mount board (200) via the second gate wire (WG2) allows the second gate electrode (82) and the second gate line portion (GG2) to be electrically connected together, thus enabling reducing the length of the second gate wire (WG2).

In a bidirectional switch module (100B) according to a sixteenth aspect, which may be implemented in conjunction with the thirteenth aspect, the mount board (200B) further includes a plurality of first source line extensions (SS11) and a plurality of second source line extensions (SS21). The plurality of first source line extensions (SS11) extend from the first source line portion (SS1) toward the second source line portion (SS2). The plurality of second source line extensions (SS21) extend from the second source line portion (SS2) toward the first source line portion (SS1). The plurality of first source line extensions (SS11) and the plurality of second source line extensions (SS21) are arranged alternately one by one. One bidirectional switch (1; 1A; 1C; 1D; 1E), out of the plurality of bidirectional switches (1; 1A; 1C; 1D; 1E), is provided between each pair of one first source line extension (SS11) and one second source line extension (SS21) which are adjacent to each other and which belong to the plurality of first source line extensions (SS11) and the plurality of second source line extensions (SS21), respectively.

The bidirectional switch module (100B) according to the sixteenth aspect allows the first source electrode pads (S1) of the bidirectional switches (1; 1A; 1C; 1D; 1E) to be electrically connected to the first source line extensions (SS11) on the mount board (200B) via the first source wires (WS1) and also enables a larger amount of current to flow through itself by increasing the number of the first source wires (WS1). In addition, the bidirectional switch module (100B; 100E; 100F) according to the sixteenth aspect also allows the second source electrode pads (S2) of the bidirectional switches (1; 1A; 1C; 1D; 1E) to be electrically connected to the second source line extensions (SS21) on the mount board (200B) via the second source wires (WS2) and also enables a larger amount of current to flow through itself by increasing the number of the second source wires (WS2).

A bidirectional switch (1C; 1D) according to a seventeenth aspect includes a first source electrode (71), a first gate electrode (81), a second gate electrode (82), and a second source electrode (72). The first source electrode (71) includes a plurality of first source electrode comb teeth (711). The first gate electrode (81) includes a plurality of first gate electrode comb teeth (811). The second gate electrode (82) includes a plurality of second gate electrode comb teeth (821). The second source electrode (72) includes a plurality of second source electrode comb teeth (721). The plurality of first source electrode comb teeth (711) and the plurality of second source electrode comb teeth (721) are alternately arranged one by one. Between each pair of a first source electrode comb tooth (711) and a second source electrode comb tooth (721) which are adjacent to each other, one first gate electrode comb tooth (811), out of the plurality of first gate electrode comb teeth (811), and one second gate electrode comb tooth (821), out of the plurality of second gate electrode comb teeth (821), are arranged side by side in this order from the first source electrode comb tooth (711) toward the second source electrode comb tooth (721). The bidirectional switch (1C; 1D) further includes a first source electrode pad (S1), a first gate electrode pad (G1), a second gate electrode pad (G2), and a second source electrode pad (S2). The first source electrode pad (S1) is electrically connected to the plurality of first source electrode comb teeth (711). The first gate electrode pad (G1) is electrically connected to the plurality of first gate electrode comb teeth (811). The second gate electrode pad (G2) is electrically connected to the plurality of second gate electrode comb teeth (821). The second source electrode pad (S2) is electrically connected to the plurality of second source electrode comb teeth (721). The bidirectional switch (1C; 1D) has a first side (11) and a second side (12) which are parallel to each other in a plan view, and a third side (13) and a fourth side (14) which are parallel to each other in a plan view. The first source electrode pad (S1) is arranged along the first side (11). The second source electrode pad (S2) is arranged along the second side (12). The first gate electrode pad (G1) is arranged along the third side (13). The second gate electrode pad (G2) is arranged along the fourth side (14). A distance between the first gate electrode pad (G1) and the first source electrode pad (S1) is shorter than a distance between the first gate electrode pad (G1) and the second source electrode pad (S2). A distance between the second gate electrode pad (G2) and the second source electrode pad (S2) is shorter than a distance between the second gate electrode pad (G2) and the first source electrode pad (S1).

The bidirectional switch (1C; 1D) according to the seventeenth aspect allows the first gate wire (WG1) and the second gate wire (WG2) to be formed with approximately the same length by implementing the first gate wire (WG1) and the second gate wire (WG2) on the mount board (200B), for example. In addition, the bidirectional switch (1C; 1D) according to the seventeenth aspect also enables a larger amount of current to flow through itself by connecting a plurality of bidirectional switches (1C; 1D) together in parallel.

A bidirectional switch (1E) according to an eighteenth aspect includes a first source electrode (71), a first gate electrode (81), a second gate electrode (82), and a second source electrode (72). The first source electrode (71) includes a plurality of first source electrode comb teeth (711). The first gate electrode (81) includes a plurality of first gate electrode comb teeth (811). The second gate electrode (82) includes a plurality of second gate electrode comb teeth (821). The second source electrode (72) includes a plurality of second source electrode comb teeth (721). The plurality of first source electrode comb teeth (711) and the plurality of second source electrode comb teeth (721) are alternately arranged one by one. Between each pair of a first source electrode comb tooth (711) and a second source electrode comb tooth (721) which are adjacent to each other, one first gate electrode comb tooth (811), out of the plurality of first gate electrode comb teeth (811), and one second gate electrode comb tooth (821), out of the plurality of second gate electrode comb teeth (821), are arranged side by side in this order from the first source electrode comb tooth (711) toward the second source electrode comb tooth (721). The bidirectional switch (1E) further includes a first source electrode pad (S1), two first gate electrode pads (G1), two second gate electrode pads (G2), and a second source electrode pad (S2). The first source electrode pad (S1) is electrically connected to the plurality of first source electrode comb teeth (711). The two first gate electrode pads (G1) are electrically connected to the plurality of first gate electrode comb teeth (811). The two second gate electrode pads (G2) are electrically connected to the plurality of second gate electrode comb teeth (821). The second source electrode pad (S2) is electrically connected to the plurality of second source electrode comb teeth (721). The bidirectional switch (1E) has a first side (11) and a second side (12) which are parallel to each other in a plan view, and a third side (13) and a fourth side (14) which are parallel to each other in a plan view. The first source electrode pad (S1) is arranged along the first side (11). The second source electrode pad (S2) is arranged along the second side (12). One first gate electrode pad (G1), out of the two first gate electrode pads (G1), and one second gate electrode pad (G2), out of the two second gate electrode pads (G2), are arranged along the third side (13). Between the first source electrode pad (S1) and the second source electrode pad (S2), the one first gate electrode pad (G1) is located closer to the first source electrode pad (S1) than to the second source electrode pad (S2), and the one second gate electrode pad (G2) is located closer to the second source electrode pad (S2) than to the first source electrode pad (S1). The other first gate electrode pad (G1), out of the two first gate electrode pads (G1), and the other second gate electrode pad (G2), out of the two second gate electrode pads (G2), are arranged along the fourth side (14). Between the first source electrode pad (S1) and the second source electrode pad (S2), the other first gate electrode pad (G1) is located closer to the first source electrode pad (S1) than to the second source electrode pad (S2), and the other second gate electrode pad (G2) is located closer to the second source electrode pad (S2) than to the first source electrode pad (S1).

The bidirectional switch (1E) according to the eighteenth aspect allows bidirectional switches (1E) of the same type to be used as a plurality of bidirectional switches to be mounted on the mount board (200B), for example. Mounting the plurality of bidirectional switches (1E) on the mount board (200B) and connecting the plurality of bidirectional switches (1E) together in parallel contributes to enabling a larger amount of current to flow through the bidirectional switches (1E).

REFERENCE SIGNS LIST 1, 1A, 1B, 1C, 1D, 1E, 1G Bidirectional Switch
11 First Side
12 Second Side
13 Third Side
14 Fourth Side
2 Substrate
3 Buffer Layer
4 First Nitride Semiconductor Layer
5 Second Nitride Semiconductor Layer
61 First p-type Layer
62 Second p-type Layer
71 First Source Electrode
711 First Source Electrode Comb Tooth
72 Second Source Electrode
721 Second Source Electrode Comb Tooth
81 First Gate Electrode
811 First Gate Electrode Comb Tooth
82 Second Gate Electrode
821 Second Gate Electrode Comb Tooth
100, 100A, 100B, 100C, 100D, 100E, 100F, 100G Bidirectional Switch Module
200, 200A, 200B, 200C, 200D, 200G Mount Board
201 Insulating Substrate
203 Conductor Portion
202, 204, 205, 206, 207 Die Pad Portion
G1 First Gate Electrode Pad
G2 Second Gate Electrode Pad
GG1 First Gate Line Portion
GG11 First Gate Line Extension
GG2 Second Gate Line Portion
GG21 Second Gate Line Extension
S1 First Source Electrode Pad
S2 Second Source Electrode Pad
SS1 First Source Line Portion
SS11 First Source Line Extension
SS2 Second Source Line Portion
SS21 Second Source Line Extension
WG1 First Gate Wire
WG2 Second Gate Wire
WS1 First Source Wire
WS2 Second Source Wire

The invention claimed is:
1. A bidirectional switch module comprising:
a plurality of bidirectional switches, each of the plurality of bidirectional switches including a first source electrode, a first gate electrode, a second gate electrode, and a second source electrode; and
a mount board on which the plurality of bidirectional switches are mounted,
the plurality of bidirectional switches being connected in parallel,
wherein
in each of the plurality of bidirectional switches,
the first source electrode includes a plurality of first source electrode comb teeth,
the first gate electrode includes a plurality of first gate electrode comb teeth,
the second gate electrode includes a plurality of second gate electrode comb teeth, the second source electrode includes a plurality of second source electrode comb teeth, and the plurality of first source electrode comb teeth and the plurality of second source electrode comb teeth are alternately arranged one by one, and between each pair of a first source electrode comb tooth and a second source electrode comb tooth which are adjacent to each other, one first gate electrode comb tooth, out of the plurality of first gate electrode comb teeth, and one second gate electrode comb tooth, out of the plurality of second gate electrode comb teeth, are arranged side by side in this order from the first source electrode comb tooth toward the second source electrode comb tooth, each of the plurality of bidirectional switches further includes:

a first source electrode pad electrically connected to the plurality of first source electrode comb teeth;

a first gate electrode pad electrically connected to the plurality of first gate electrode comb teeth;

a second gate electrode pad electrically connected to the plurality of second gate electrode comb teeth; and a second source electrode pad electrically connected to the plurality of second source electrode comb teeth, each of the plurality of bidirectional switches has a first side and a second side which are parallel to each other in a plan view, and a third side and a fourth side which are parallel to each other in a plan view, the first source electrode pad is arranged along the first side, the second source electrode pad is arranged along the second side, the first gate electrode pad and the second gate electrode pad are arranged along the third side, and in a direction aligned with the third side, the first source electrode pad, the first gate electrode pad, the second gate electrode pad, and the second source electrode pad are arranged side by side in this order.

2. The bidirectional switch module of claim 1, wherein each of the plurality of bidirectional switches has a rectangular shape in a plan view.

3. The bidirectional switch module of claim 1, wherein the mount board includes:

an insulating substrate; and a first source line portion, a first gate line portion, a second gate line portion, and a second source line portion, all of which are arranged on the insulating substrate, and the bidirectional switch module further includes, for each of the plurality of bidirectional switches:

a first source wire electrically connecting the first source electrode of the bidirectional switch to the first source line portion;

a first gate wire electrically connecting the first gate electrode of the bidirectional switch to the first gate line portion;

a second gate wire electrically connecting the second gate electrode of the bidirectional switch to the second gate line portion; and a second source wire electrically connecting the second source electrode of the bidirectional switch to the second source line portion.

4. The bidirectional switch module of claim 3, wherein on the mount board, the first source line portion, the first gate line portion, the second gate line portion, and the second source line portion are arranged side by side in this order in a plan view, and the plurality of bidirectional switches are provided between, and out of contact with, the first gate line portion and the second gate line portion.

5. The bidirectional switch module of claim 3, wherein on the mount board, the first gate line portion, the first source line portion, the second source line portion, and the second gate line portion are arranged side by side in this order in a plan view, and the plurality of bidirectional switches are provided between, and out of contact with, the first source line portion and the second source line portion.

6. The bidirectional switch module of claim 3, wherein on the mount board, the first gate line portion, the second gate line portion, the first source line portion, and the second source line portion are arranged side by side in this order in a plan view, and the plurality of bidirectional switches are provided between, and out of contact with, the first source line portion and the second source line portion.

7. The bidirectional switch module of claim 4, wherein the mount board further includes:

a plurality of first gate line extensions extending from the first gate line portion toward the second gate line portion; and a plurality of second gate line extensions extending from the second gate line portion toward the first gate line portion, the plurality of first gate line extensions are associated one to one with the plurality of bidirectional switches, each of the plurality of first gate line extensions being adjacent to an associated one of the plurality of bidirectional switches, the plurality of second gate line extensions are associated one to one with the plurality of bidirectional switches, each of the plurality of second gate line extensions being adjacent to an associated one of the plurality of bidirectional switches, and on the mount board, the plurality of first gate line extensions and the plurality of second gate line extensions correspond one to one, and each of the first gate line extensions and a corresponding one of the second gate line extensions are arranged such that their respective tips face each other.

8. The bidirectional switch module of claim 5, wherein the mount board further includes:

a plurality of first source line extensions extending from the first source line portion toward the second source line portion; and a plurality of second source line extensions extending from the second source line portion toward the first source line portion, the plurality of first source line extensions and the plurality of second source line extensions are arranged alternately one by one, and one bidirectional switch, out of the plurality of bidirectional switches, is provided between each pair of one first source line extension and one second source line extension which are adjacent to each other and which belong to the plurality of first source line extensions and the plurality of second source line extensions, respectively.

9. A bidirectional switch comprising a first source electrode, a first gate electrode, a second gate electrode, and a second source electrode,
the first source electrode including a plurality of first source electrode comb teeth,
the first gate electrode including a plurality of first gate electrode comb teeth,
the second gate electrode including a plurality of second gate electrode comb teeth,
the second source electrode including a plurality of second source electrode comb teeth,
the plurality of first source electrode comb teeth and the plurality of second source electrode comb teeth being alternately arranged one by one, and between each pair of a first source electrode comb tooth and a second source electrode comb tooth which are adjacent to each other, one first gate electrode comb tooth, out of the plurality of first gate electrode comb teeth, and one second gate electrode comb tooth, out of the plurality of second gate electrode comb teeth, being arranged side by side in this order from the first source electrode comb tooth toward the second source electrode comb tooth,
the bidirectional switch further comprising:
a first source electrode pad electrically connected to the plurality of first source electrode comb teeth;
a first gate electrode pad electrically connected to the plurality of first gate electrode comb teeth;
a second gate electrode pad electrically connected to the plurality of second gate electrode comb teeth; and
a second source electrode pad electrically connected to the plurality of second source electrode comb teeth;
the bidirectional switch having
a first side and a second side which are parallel to each other in a plan view, and
a third side and a fourth side which are parallel to each other in a plan view,
the first source electrode pad being arranged along the first side,
the second source electrode pad being arranged along the second side,
the first gate electrode pad being arranged along the third side,
the second gate electrode pad being arranged along the fourth side,
a distance between the first gate electrode pad and the first source electrode pad being shorter than a distance between the first gate electrode pad and the second source electrode pad, and
a distance between the second gate electrode pad and the second source electrode pad being shorter than a distance between the second gate electrode pad and the first source electrode pad.

10. A bidirectional switch comprising a first source electrode, a first gate electrode, a second gate electrode, and a second source electrode,
the first source electrode including a plurality of first source electrode comb teeth,
the first gate electrode including a plurality of first gate electrode comb teeth,
the second gate electrode including a plurality of second gate electrode comb teeth,
the second source electrode including a plurality of second source electrode comb teeth,
the plurality of first source electrode comb teeth and the plurality of second source electrode comb teeth being alternately arranged one by one, between each pair of a first source electrode comb tooth and a second source electrode comb tooth which are adjacent to each other, one first gate electrode comb tooth, out of the plurality of first gate electrode comb teeth, and one second gate electrode comb tooth, out of the plurality of second gate electrode comb teeth, being arranged side by side in this order from the first source electrode comb tooth toward the second source electrode comb tooth,
the bidirectional switch further comprising:
a first source electrode pad electrically connected to the plurality of first source electrode comb teeth;
two first gate electrode pads electrically connected to the plurality of first gate electrode comb teeth;
two second gate electrode pads electrically connected to the plurality of second gate electrode comb teeth; and
a second source electrode pad electrically connected to the plurality of second source electrode comb teeth;
the bidirectional switch having
a first side and a second side which are parallel to each other in a plan view, and
a third side and a fourth side which are parallel to each other in a plan view,
the first source electrode pad being arranged along the first side,
the second source electrode pad being arranged along the second side,
one first gate electrode pad, out of the two first gate electrode pads, and one second gate electrode pad, out of the two second gate electrode pads, being arranged along the third side,
between the first source electrode pad and the second source electrode pad, the one first gate electrode pad being located closer to the first source electrode pad than to the second source electrode pad, and the one second gate electrode pad being located closer to the second source electrode pad than to the first source electrode pad,
the other first gate electrode pad, out of the two first gate electrode pads, and the other second gate electrode pad, out of the two second gate electrode pads, being arranged along the fourth side, and
between the first source electrode pad and the second source electrode pad, the other first gate electrode pad being located closer to the first source electrode pad than to the second source electrode pad, and the other second gate electrode pad being located closer to the second source electrode pad than to the first source electrode pad.

11. The bidirectional switch module of claim 1, wherein each of the plurality of bidirectional switches is a lateral transistor.

12. The bidirectional switch module of claim 11, wherein each of the plurality of bidirectional switches includes:
a substrate;
a first nitride semiconductor layer formed over the substrate; and
a second nitride semiconductor layer formed on the first nitride semiconductor layer and having a larger bandgap than the first nitride semiconductor layer, and
in each of the plurality of bidirectional switches, the first source electrode, the first gate electrode, the second gate electrode, and the second source electrode are formed on or over the second nitride semiconductor layer.

13. The bidirectional switch module of claim 12, wherein each of the plurality of bidirectional switches further includes:
a first p-type layer interposed between the first gate electrode and the second nitride semiconductor layer; and
a second p-type layer interposed between the second gate electrode and the second nitride semiconductor layer.

14. The bidirectional switch module of claim 13, wherein in each of the plurality of bidirectional switches,
the substrate has electrical conductivity,
the substrate is electrically insulated from all of the first source electrode, the second source electrode, the first gate electrode, and the second gate electrode,
the mount board includes a conductor portion to which the respective substrates of the plurality of bidirectional switches are electrically connected, and
the conductor portion includes a plurality of die pad portions associated one to one with the plurality of bidirectional switches, each of the plurality of die pad portions mounting an associated one of the plurality of bidirectional switches thereon.

15. A bidirectional switch module comprising:
a plurality of bidirectional switches, each of the plurality of bidirectional switches being the bidirectional switch of claim 9; and
a mount board on which the plurality of bidirectional switches are mounted,
the plurality of bidirectional switches being connected in parallel.

16. A bidirectional switch module comprising:
a plurality of bidirectional switches, each of the plurality of bidirectional switches being the bidirectional switch of claim 10; and
a mount board on which the plurality of bidirectional switches are mounted,
the plurality of bidirectional switches being connected in parallel.

* * * * *